(12) United States Patent
Suzuki et al.

(10) Patent No.: US 7,570,494 B2
(45) Date of Patent: Aug. 4, 2009

(54) STRUCTURE OF FLEXIBLE PRINTED CIRCUIT BOARD

(75) Inventors: Shigeru Suzuki, Nagoya (JP); Yasuhiro Kato, Nagoya (JP); Tomoyuki Kubo, Kasugai (JP); Koji Imai, Inuyama (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

(21) Appl. No.: 11/481,523

(22) Filed: Jul. 6, 2006

(65) Prior Publication Data

US 2006/0250451 A1 Nov. 9, 2006

(51) Int. Cl.
*H05K 1/18* (2006.01)
(52) U.S. Cl. ............................ 361/762; 29/830; 347/56
(58) Field of Classification Search ................ 361/718, 361/719, 720, 722, 736, 748, 764, 762, 777; 347/50, 54, 55, 56, 57, 58, 18, 19, 46, 70, 347/85, 166, 40, 208; 156/384; 257/686; 358/209; 400/124.18, 328; 438/107; 174/254, 174/260; 29/830, 840
See application file for complete search history.

(56) References Cited

U.S. PATENT DOCUMENTS

| | | | | |
|---|---|---|---|---|
| 4,110,598 A | * | 8/1978 | Small | 347/208 |
| 4,539,576 A | * | 9/1985 | Chance et al. | 347/166 |
| 4,614,561 A | * | 9/1986 | Mistyurik | 156/384 |
| 4,626,872 A | * | 12/1986 | Takeno | 347/204 |
| 4,681,467 A | * | 7/1987 | Karidis | 400/124.18 |
| 4,689,638 A | * | 8/1987 | Matsuzaki et al. | 347/209 |
| 4,709,248 A | * | 11/1987 | Piatt et al. | 347/14 |
| 4,947,183 A | * | 8/1990 | Yagino | 347/201 |
| 5,267,221 A | * | 11/1993 | Miller et al. | 367/140 |
| 5,861,899 A | * | 1/1999 | Nguyen et al. | 347/40 |
| 5,871,292 A | * | 2/1999 | Johnson et al. | 400/328 |
| 5,880,754 A | * | 3/1999 | Niikura et al. | 347/18 |
| 5,923,825 A | * | 7/1999 | Orlicki et al. | 358/1.12 |
| 5,975,679 A | * | 11/1999 | Nicoloff et al. | 347/43 |
| 6,102,514 A | * | 8/2000 | Otsuka et al. | 347/17 |
| 6,116,716 A | * | 9/2000 | Tajika et al. | 347/19 |
| 6,120,130 A | * | 9/2000 | Hirano et al. | 347/46 |
| 6,137,508 A | * | 10/2000 | Gaarder | 347/50 |
| 6,190,006 B1 | | 2/2001 | Kurashima et al. | |
| 6,270,193 B1 | * | 8/2001 | Hiwada | 347/50 |

(Continued)

FOREIGN PATENT DOCUMENTS

JP 4-133780 5/1992

(Continued)

*Primary Examiner*—Dean A. Reichard
*Assistant Examiner*—Xiaoling Chen
(74) *Attorney, Agent, or Firm*—Reed Smith LLP

(57) ABSTRACT

A recording apparatus that has a recording head and a flexible printed circuit board. The recording head, which performs recording on a recording medium, has a plurality of recording elements. One end of the flexible printed circuit board has plurality of feeder wires that connect to one of the terminal lands of each of the recording elements. A first common voltage wire connects the other terminal lands of each of the recording elements to a common potential. A drive circuit is attached to the flexible printed circuit board to drive the recording head via the feeder wires. The other end of the flexible printed circuit board is connected to another circuit board used by the recording apparatus.

10 Claims, 18 Drawing Sheets

U.S. PATENT DOCUMENTS

| | | |
|---|---|---|
| 6,390,602 B1 | 5/2002 | Katakura et al. |
| 6,409,309 B1 * | 6/2002 | Tanikawa et al. ............... 347/54 |
| 6,417,600 B2 | 7/2002 | Kitahara |
| 6,439,702 B1 * | 8/2002 | Karlinski ..................... 347/70 |
| 6,624,552 B2 | 9/2003 | Kitahara |
| 6,862,782 B2 | 3/2005 | Kitahara |
| 2001/0030836 A1 * | 10/2001 | Katsumata ............... 360/244.1 |
| 2001/0040620 A1 * | 11/2001 | Wakisaka et al. ........... 347/263 |
| 2005/0253883 A1 * | 11/2005 | Kato .......................... 347/12 |

FOREIGN PATENT DOCUMENTS

| | | |
|---|---|---|
| JP | 5-455 | 1/1993 |
| JP | 5290905 | 11/1993 |
| JP | 6286127 | 10/1994 |
| JP | 10006496 | 1/1998 |
| JP | 10-76685 | 3/1998 |
| JP | 10-230603 | 9/1998 |
| JP | 11 291465 | 10/1999 |
| JP | 10-300956 | 11/1999 |
| JP | 11300956 | 11/1999 |
| JP | 2000-062162 | 2/2000 |
| JP | 2000-94677 | 4/2000 |

* cited by examiner

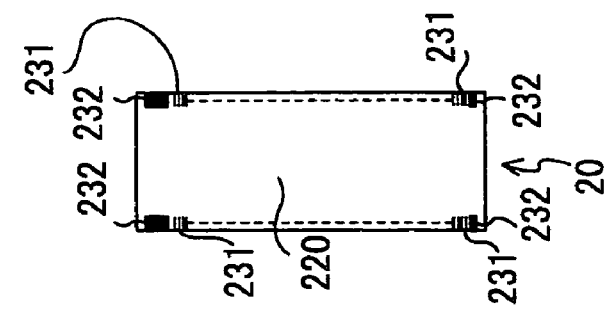
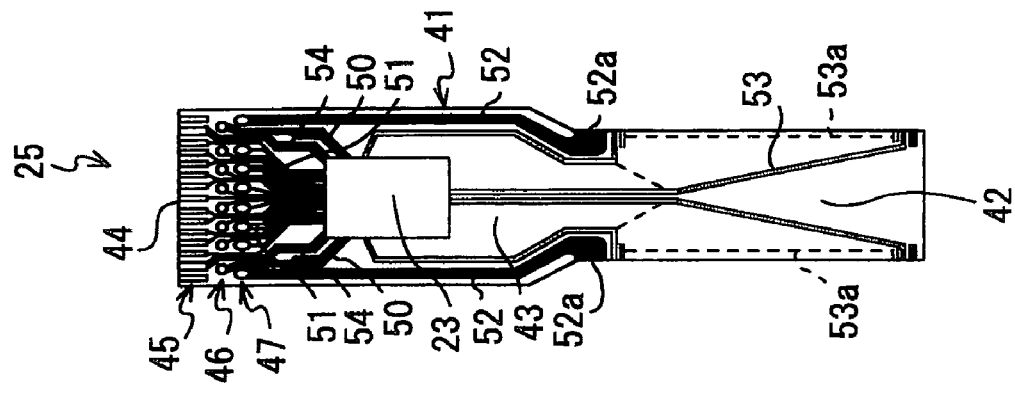
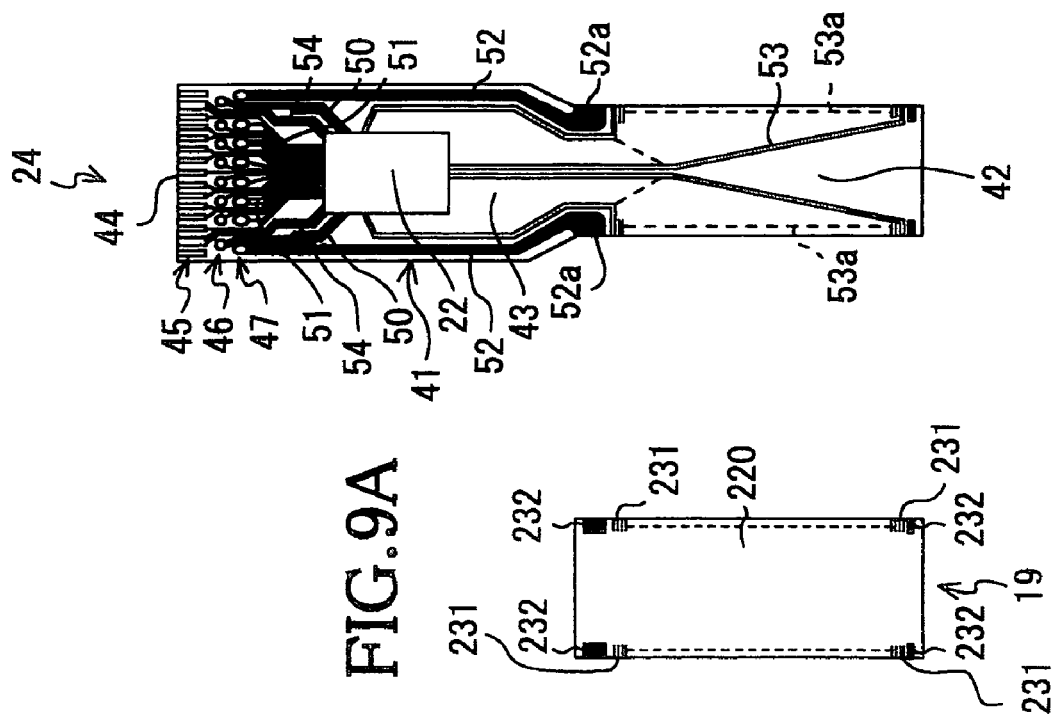

STRUCTURE OF FLEXIBLE PRINTED CIRCUIT BOARD

BACKGROUND OF THE INVENTION

1. Field of Invention

The invention relates to a structure of circuit boards.

2. Description of Related Art

A flexible printed circuit board has been used in electronic equipment to supply power and signals therein. The flexible printed circuit board connects two circuit boards or parts, to each other, passing through a narrow portion or a zigzag path, so that the circuit boards and parts can be placed at any location. Accordingly, the flexible printed circuit board offers design freedom in electronic equipment, and particularly, saves an amount of a wasted space, thereby downsizing the equipment. The flexible printed circuit board is provided with an IC chip and a circuit connecting the IC chip. However, the conventional flexible printed circuit board may not have sufficient electric properties.

SUMMARY OF THE INVENTION

It is therefore an object of the invention to provide a circuit board having excellent electric properties.

According to one embodiment of the invention, a connection structure between a flexible printed circuit board and a circuit board includes a flexible printed circuit board and a circuit board. The flexible printed circuit board has a flexible insulation member and includes a wire and a terminal land on the flexible insulation member. The circuit board includes a conductor pattern connected with the wire of the flexible printed circuit board, and a terminal having a through hole passing through the circuit board. In this connection structure, the terminal land of the flexible printed circuit board, opposed to the terminal of the circuit board, does not have a through hole therein. The terminal land of the flexible printed circuit board is connected with the terminal land of the circuit board using solder. When the terminal lands of the flexible printed circuit board and the circuit board are connected with each other, excessive melted solder enters the through hole.

According to another embodiment of the invention, a recording apparatus includes a recording head that further includes a plurality of recording elements having terminal lands and performs recording on a recording medium, a flexible printed circuit board that further includes a flexible insulation member, a plurality of feeder wires that connects one of the terminal lands of each of the recording elements, a first common voltage wire that connects the other terminal lands of each of the recording elements to a common potential, and a drive circuit that drives the recording head via the feeder wires, wherein the drive circuit is a one-chip drive circuit, and the first common voltage wire, passing under the one-chip drive circuit, extends from one end on the recording element side to the other end on an opposite side on the flexible printed circuit board.

BRIEF DESCRIPTION OF THE DRAWINGS

An exemplary embodiment of the invention will be described in detail with reference to the following figures wherein:

FIG. 9A is a plan view of a printhead for yellow and magenta inks;

FIG. 9B is a plan view of a flexible printed circuit board to be attached to the printhead of FIG. 9A with an IC chip mounted thereon;

FIG. 9C is a plan view of a printhead for cyan and black inks;

FIG. 9D is a plan view of a flexible wiping board to be attached to the printhead of FIG. 9C with an IC chip mounted thereon;

DETAILED DESCRIPTION OF THE PREFERRED EMBODIMENTS

An exemplary embodiment of a recording apparatus of the invention will be described with reference to the accompanying drawings. First, referring to FIG. 1, an internal structure of an ink-jet printer 1 will be described.

Figure 1:
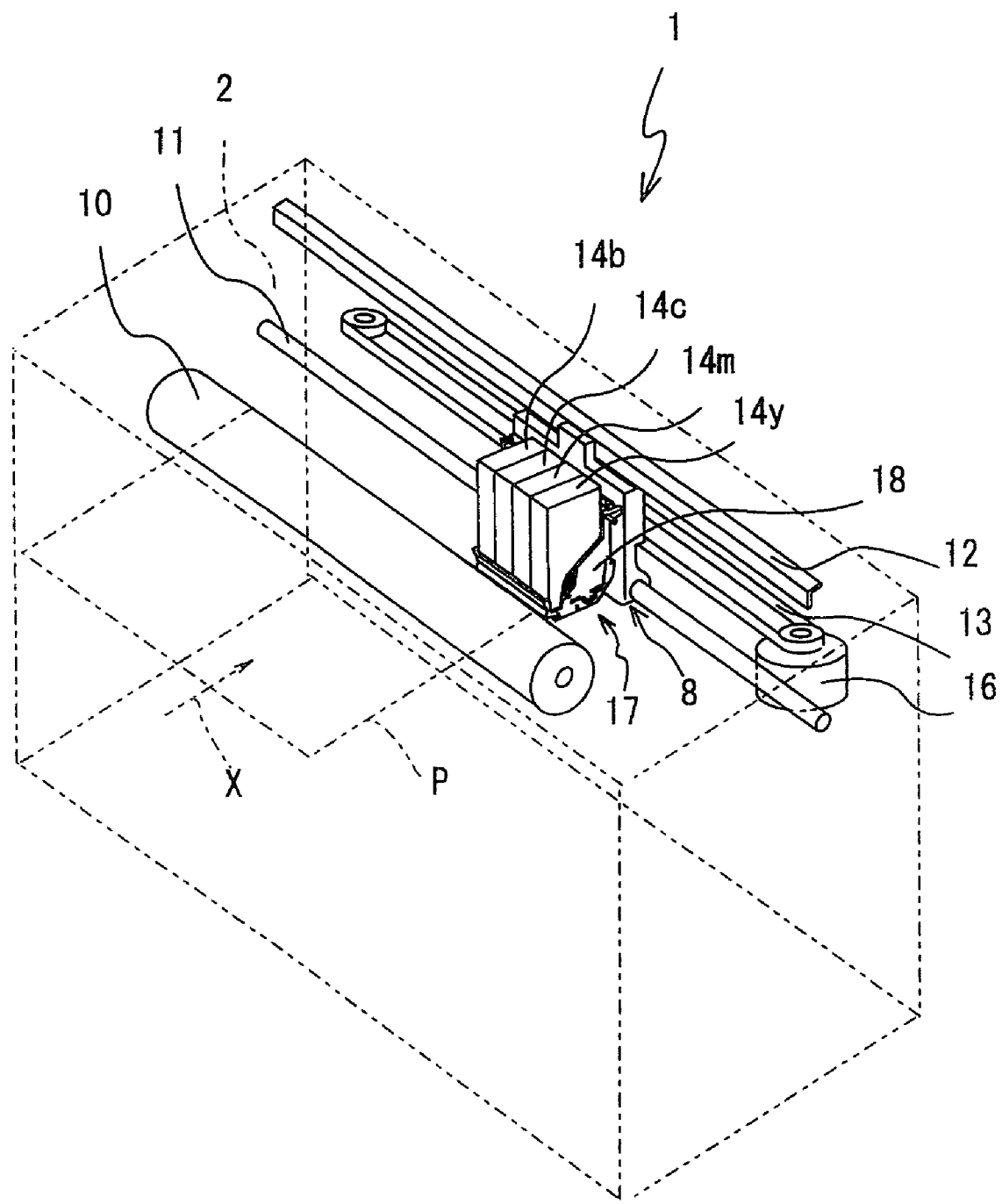
FIG. 1 is a perspective view showing an internal structure of an ink-jet printer.

As shown in FIG. 1, the ink-jet printer 1 includes a housing 2. In the housing 2, a carriage 8 is slidably supported by a guide rod 11 and a guide member 12 and fixedly attached to a belt 13 so as to reciprocate by a carriage (CR) motor 16. A printhead unit 17, having printheads 19, 20 (see FIG. 2) for performing printing, is attached to the carriage 8. The printheads 19, 20 are ink-jet printheads that perform printing on a recording sheet P, as a recording medium, by ejecting ink droplets of four different color inks (cyan c, magenta m, yellow y, and black b). Nozzle rows 7a, 7b are provided in the printhead 19 and other nozzle rows 7c, 7d are provided in the printhead 20 (see FIG. 2), so as to face the recording sheet P. The black ink b, cyan ink c, magenta ink m and yellow ink y are respectively ejected from the nozzle rows 7a, 7b, 7c, 7d.

Four ink cartridges 14b, 14c, 14m, 14y are attached to the printhead unit 17 to respectively supply ink to the nozzle rows 7a, 7b, 7c, 7d. In the ink-jet printer 1 of the embodiment, a platen roller 10 for conveying the recording sheet P is provided at a position where the platen roller 10 is opposed to the printheads 19, 20. The platen roller 10 is driven by an LF motor (not shown). As the platen roller 10 rotates, the recording sheet P is conveyed in a direction perpendicular to a carriage moving direction, that is, in a direction indicated by an arrow X in FIG. 1.

A structure of the printhead unit 17 will be described with reference to FIGS. 2 and 3. The printhead unit 17 includes a head holder 18, the printheads 19, 20, a circuit board 21, a head cover 70, flexible printed circuit boards 24, 25, and an elastic member 27 (see FIGS. 6 and 16). A heat sink 26, which also serves as a cover, is provided to the head holder 18 to cover the flexible printed circuit boards 24, 25 on a side opposite to the head holder 18. The head holder 18 is supported by the carriage 8 so as to reciprocate with the carriage 8, as shown in FIG. 1.

The head holder 18 is molded in one-piece of synthetic resin so as to be formed in a substantially box shape with upper open structure. The head holder 18 has a bottom wall 18a, a back wall 18b, a left side wall 18c (see FIG. 4), a right side wall 18d and a front wall 18e. The ink cartridges 14y, 14m, 14c, 14b are placed into a space 18a2 (FIG. 5) of the head holder 18. A head holding portion 28 (see FIG. 7) is provided to an outer surface 18a1 of the bottom wall 18a of the head holder 18. The printheads 19, 20, when printing an image onto the recording sheet P, are adhesively fixed to the head holding portion 28, in parallel with each other. The circuit board 21, as a junction board between the printheads 19, 20 and the carriage 8, is fixed to an outer surface 18b1 of the back wall 18b.

The printheads 19, 20 are connected with the circuit board 21 via the flexible printed circuit boards 24, 25, respectively. In this embodiment, IC chips 22, 23 are provided, as drive circuits, to generate a voltage for driving plate-type piezoelectric actuators 220 (see FIG. 10) provided in the printheads 19, 20. The flexible printed circuit boards 24 and 25 respectively have the IC chips 22 and 23 on their surfaces which do not face the head holder 18.

Figure 4:
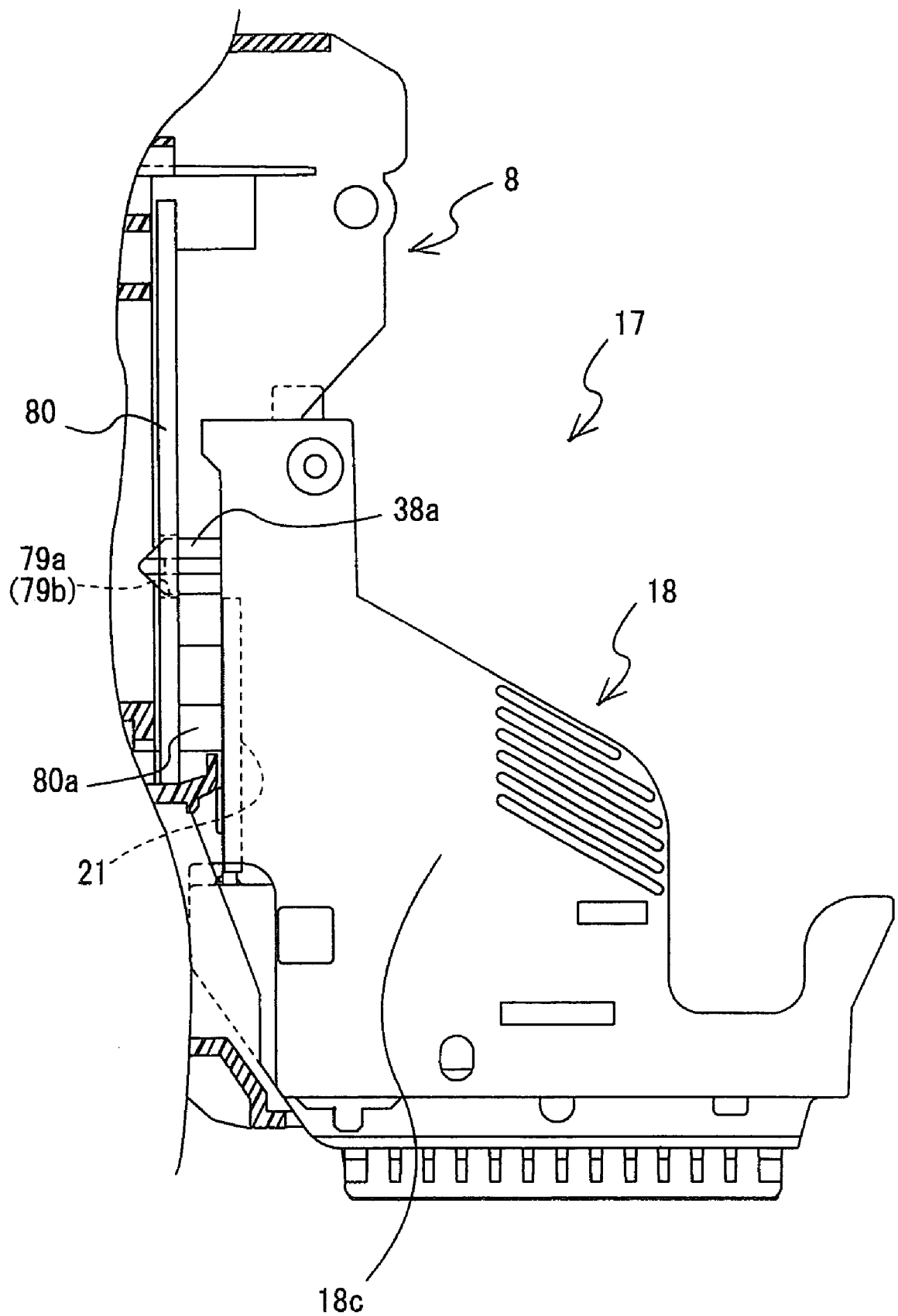
FIG. 4 is a side connection diagram of the printhead unit and a carriage.
Figure 5:
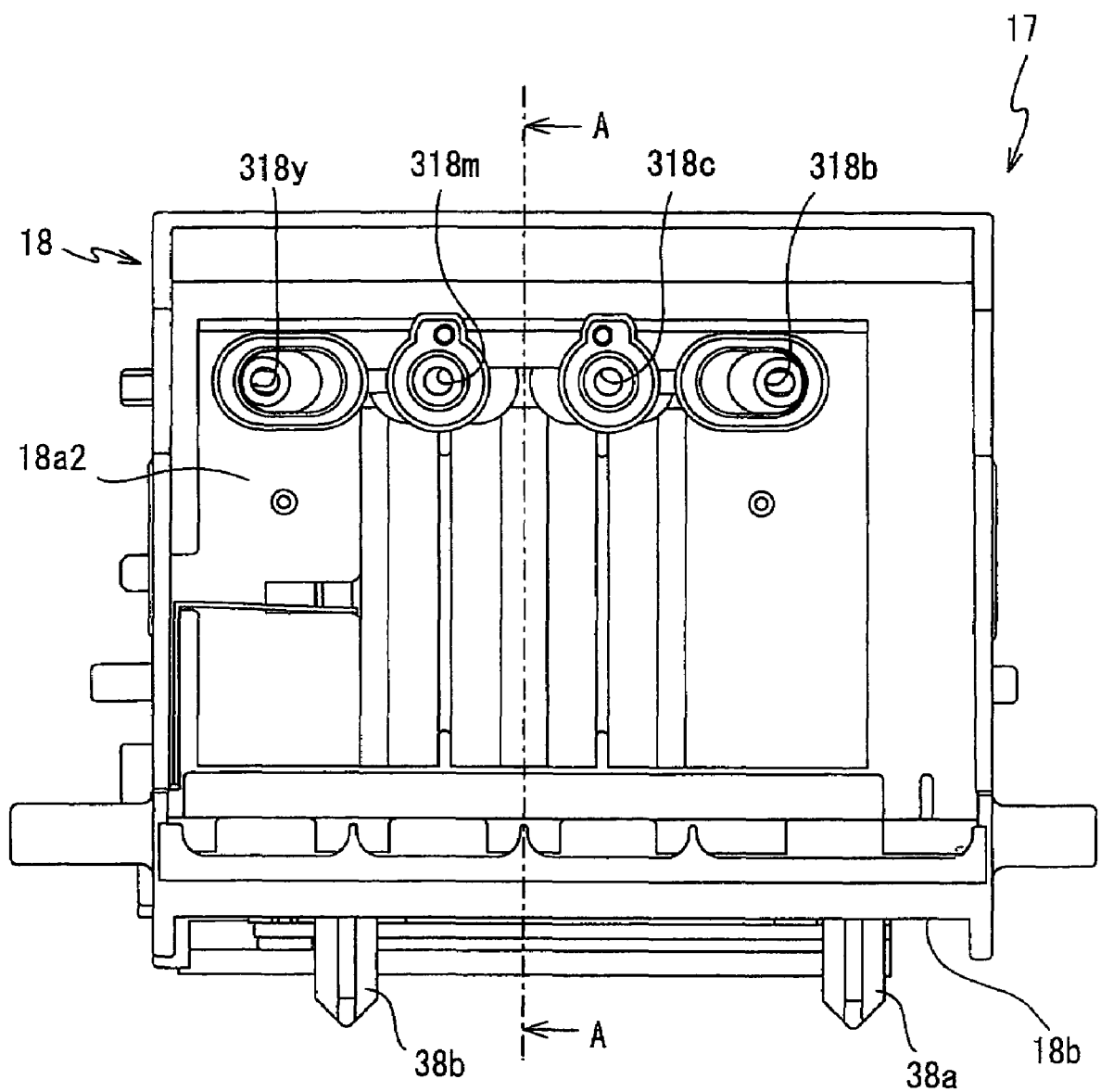
FIG. 5 is a plan view of the printhead unit.

As shown in FIG. 4, the printhead unit 17 is attached to the carriage 8 so as to move with the carriage 8. More specifically, projections 38a, 38b (FIG. 5) protrude from the back wall 18b of the head holder 18 at positions corresponding to holes 79a, 79a provided in the carriage 8. The projections 38a and 38b respectively engage the holes 79a and 79b of the carriage 8 to position the printhead unit 17. Then, the printhead unit 17 is fixed to the carriage 8 using a well-know fixing device. A circuit board 80 is provided to the carriage 8. The circuit board 80 is connected with a printer control circuit board fixed on the housing 2 of the printer 1, via a flexible printed circuit board (not shown). A connector 80a of the circuit board 80 is connected with a contact 55 (see FIG. 2) on the circuit board 21 provided to the head holder 18. With this structure, power and signals are supplied to the IC chips 22, 23 on the flexible printed circuit boards 24, 25 via the circuit board 80 of the carriage 8, from the printer control circuit board.

Figure 7:
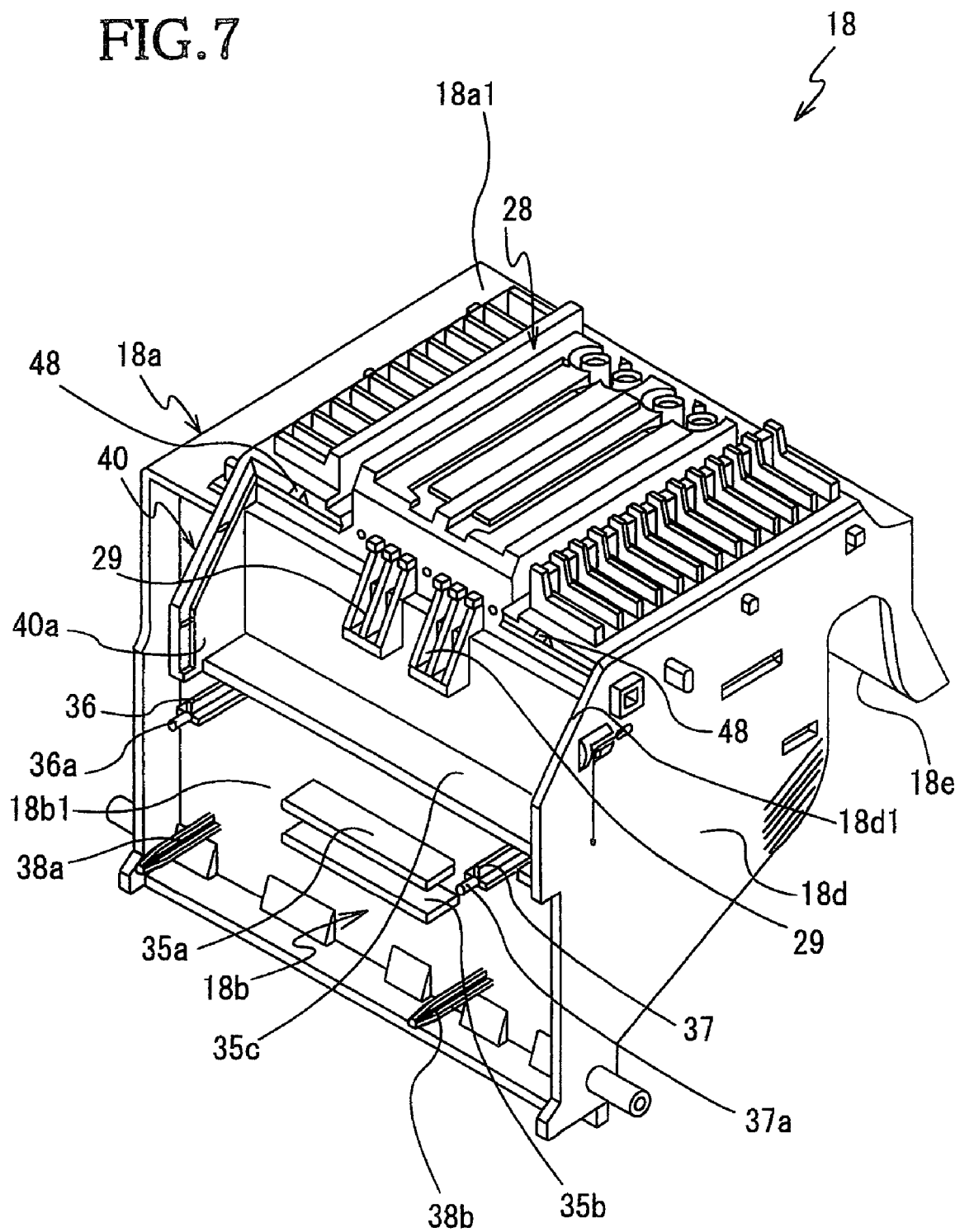
FIG. 7 is a bottom perspective view of a head holder without a head cover, when viewed from the back.
Figure 8:
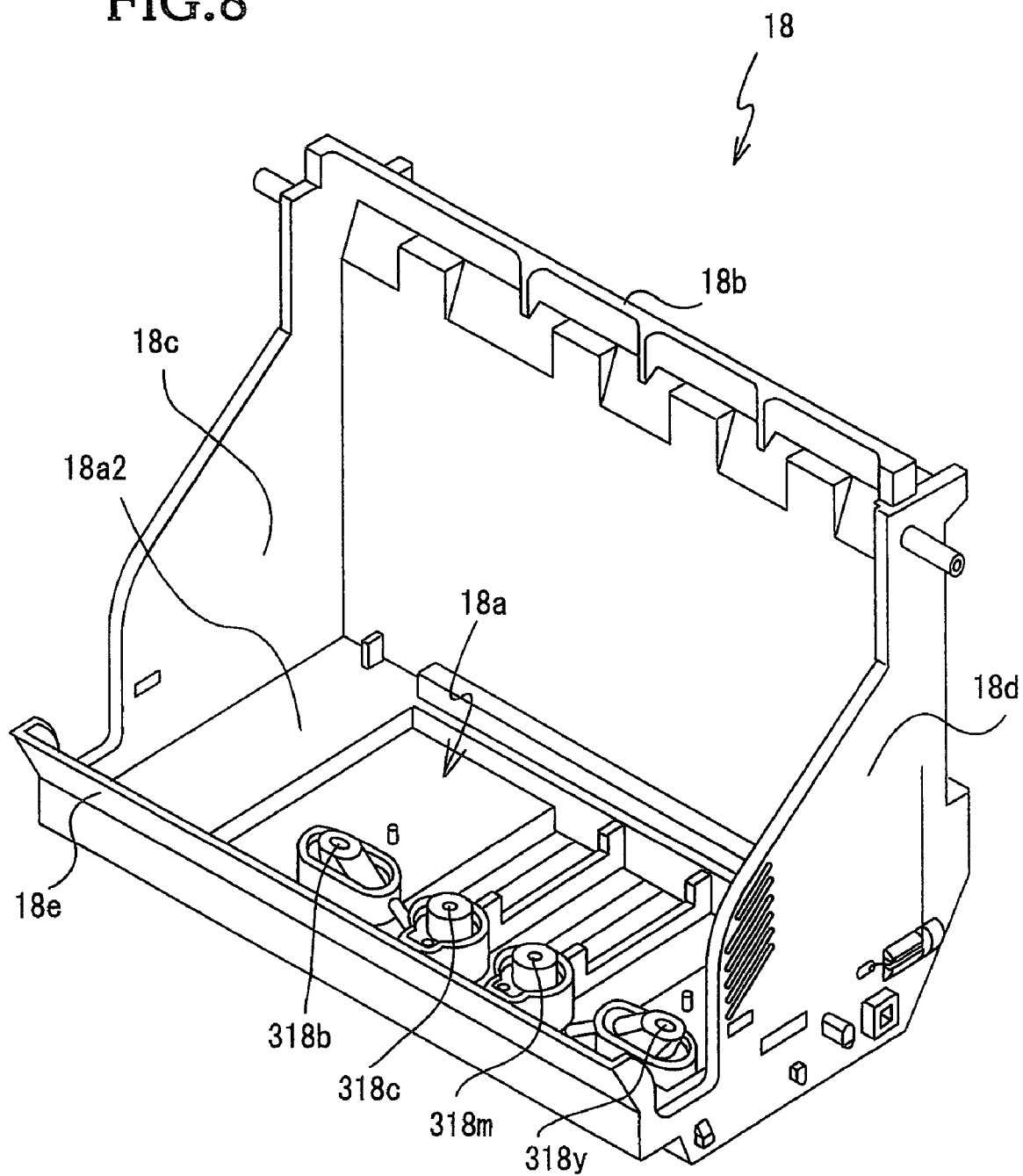
FIG. 8 is a top perspective view of the head holder when viewed from the front.

Referring to FIGS. 7 and 8, a structure of the head holder 18 will be described below. As described above, the head holder 18 has the five walls 18a to 18e and the upper open structure. As shown in FIGS. 7 and 8, the bottom wall 18a, the back wall 18b and the front wall 18e each have a substantially rectangular shape. The height of the front wall 18e is about a quarter of the height of the back wall 18b. The left and right side walls 18c, 18d have a substantially triangular shape. The left side wall 18c has a right angled portion at an intersection of the bottom wall 18a and the back wall 18b. The right side wall 18d has a bevel portion 18d1, that is beveled off at a predetermined angle, at an intersection of the bottom wall 18a and the back wall 18b.

The bottom wall 18a of the head holder 18 has a plurality of ink supply paths 318y, 318m, 318c, 318b, which connect corresponding ink outlets of the ink cartridges 14y, 14m, 14c, 14b to be attached into the space 18a2 provided on the upper side of the head holder 18. The ink supply paths 318y, 318m, 318c, 318b pass through the bottom wall 18a and reach the head holding portion 28. The ink supply paths 318y, 318m, 318c, 318b connect ink passages, corresponding to the nozzle rows 7a to 7d, of the printheads 19, 20.

Two rectangular ribs 35a, 35b protrude from the outer surface 18b1 of the back wall 18b of the head holder 18 to contact the underside of the circuit board 21 (FIG. 2) at their one ends. Protrusions 36 and 37, respectively having cylindrical portions 36a and 37a, protrude from the outer surface 18b1 of the back wall 18b. The cylindrical portions 36a, 37a are respectively inserted into through holes 21b and 21a (see FIG. 13) provided in the circuit board 21 and then crushed flat by heat, to fix the circuit board 21.

The head holder 18 supports the heat sink 26 on the side of its outer surface near the intersection of the bottom wall 18a and the back wall 18b. Specifically, a heat sink holding wall 40 is provided to protrude from the neighborhood of the bottom wall 18a and the left side wall 18c, in a manner that is substantially parallel with the portion having the bevel portion 18d1 of the right side wall 18d. The heat sink holding wall 40 has an inclined portion parallel with the bevel portion 18d1 of the right side wall 18d. The right side wall 18d is connected with the heat sink holding wall 40 via a rib 35c. Opposite surfaces of the right side wall 18d and the heat sink holding wall 40 have a heat sink holding portion 40a as a step. Heat sink holding portions 48 are also provided at the outer surface 18a1 of the bottom wall 18a near the back wall 18b.

The heat sink 26 is hermetically fixed to the head holder 18 using an adhesive while contacting the heat sink holding portions 40a, 48. A gap between the heat sink 26 and the head cover 70 and a gap between the heat sink 26 and the circuit board 21 are filled with a sealant 71 (see FIG. 6) to prevent the entry of ink and contaminants into the printheads 19, 20 and the flexible printed circuit boards 24, 25. A gap between the circuit board 21 and the rib 35c may be sealed as needed. The plate-like heat sink 26 is made of metal, such as aluminum, having high heat radiability.

An elastic member rest 29, on which the elastic member 27 (see FIGS. 6 and 16) is placed, is provided to the outer surface of the head holder 18, near the intersection of the bottom wall 18a and the back wall 18b. The elastic member rest 29 has a plurality of ribs, each of which has an inclined surface parallel with the bevel portion 18d1 of the right side wall 18d. The inclined surfaces of the ribs form an inclined wall for adhesively fixing the elastic member 27 thereto.

The structure of the flexible printed circuit boards 24, 25 will be described with reference to FIGS. 9B and 9D. As shown in FIG. 9B, the flexible printed circuit board 24 includes a band-shaped flexible insulation 41 made of polyimide resin and a plurality of wires provided on the insulation 41. The insulation 41 includes a substantially rectangular head connecting portion 42, a substantially rectangular IC chip holding portion 43, and a connector portion 44. The head connecting portion 42 is placed on a piezoelectric actuator 220 (FIG. 12) of the printhead 19 and connected with each other. The IC chip holding portion 43 extends from one shorter side of the head connecting portion 42 so as to become wider than the head connecting portion 42. The connector portion 44 connects the circuit board 21. The substantially rectangular IC chip 22 is provided on the substantially center of the IC chip holding portion 43 to generate a voltage for actuating the plate-type piezoelectric actuator 220.

The IC chip 22 has a drive circuit built-in. The drive circuit is driven by power supplied by power supply wires (plus voltage wires) 50 and common voltage wires (zero voltage wires) 54 and outputs ejection signals to output wires 53 corresponding to ejection nozzles in the nozzle rows 7a, 7b in accordance with drive signals inputted from signal wires 51. The flexible printed circuit board 24 has a conductor pattern that includes the power supply wires 50, the common voltage wires 54, the signal wires 51, the output wires 53, and common voltage wires 52 provided along longer side edges of the flexible printed circuit board 24. The conductor pattern is substantially symmetrical about a center line with respect to a longitudinal side of the flexible printed circuit board 24. In accordance with this structure, the IC chip 22 has two drive circuits built therein. Terminals 52a of the common voltage wires 52 and terminals 53a of the output wires 53 are provided along the longer side edges of the head connecting portion 42.

The connector portion 44 of the flexible printed circuit board 24 includes a plurality of input terminal land rows 45, 46, 47, which are made up of ends of the common voltage wires 52, the power supply wires 50, the common voltage wires 54 and the signal wires 51. The input terminal land rows 45, 46, 47 are provided in several rows so that the flexible printed circuit board 24 can be within a predetermined width while a width of each input terminal land of the signal wires 51 is widened more than a width of each signal wire 51. The flexible printed circuit board 25 has the same structure as the flexible printed circuit board 24 and the similar IC chip 23 mounted thereon.

Figure 13:
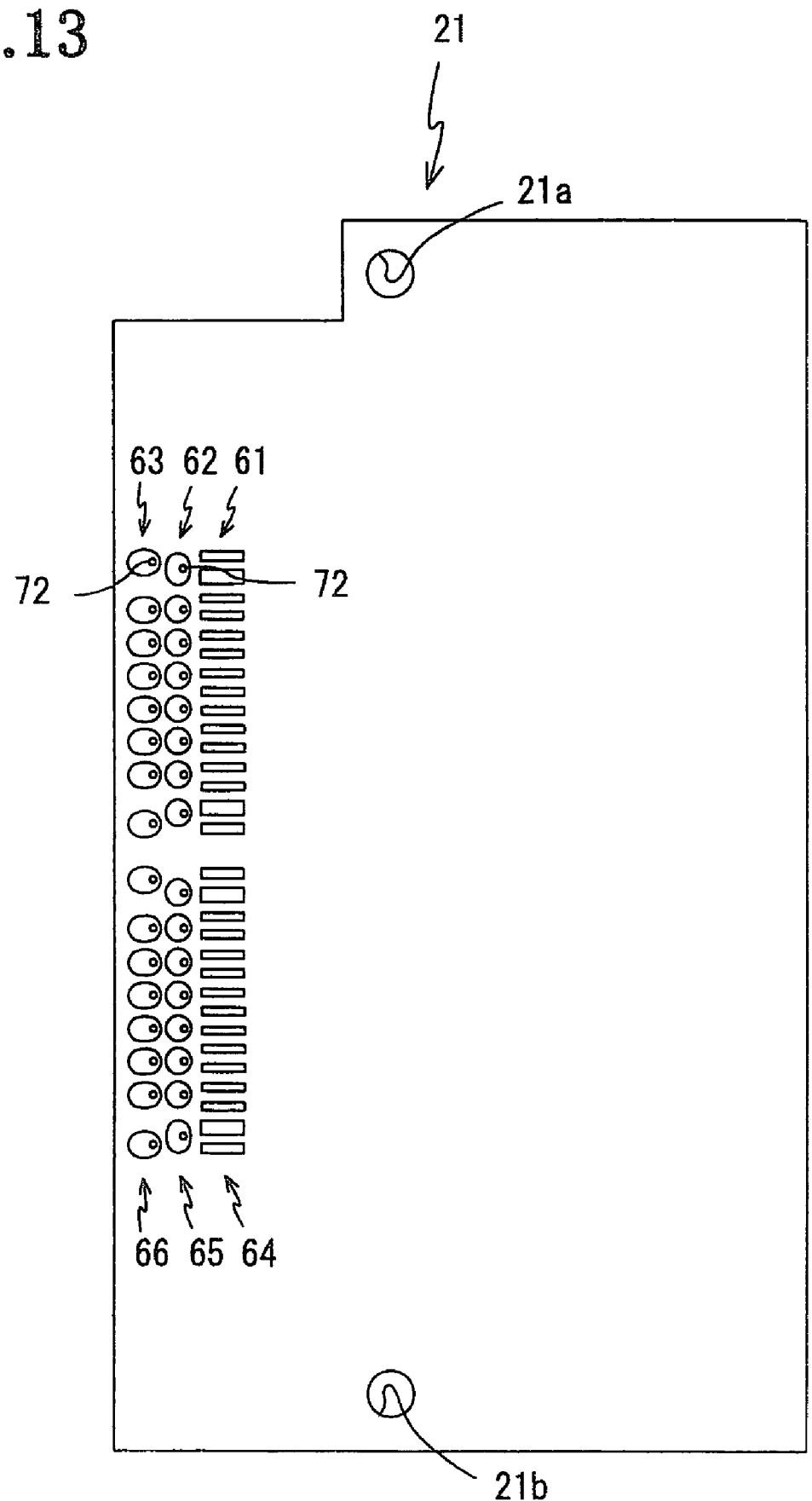
FIG. 13 is a plan view of a circuit board.

The circuit board 21 is generally an insulating substrate having a certain stiffness and rigidity. As shown in FIG. 13, one side of the circuit board 21 has output terminal land rows 61, 62, 63 which respectively correspond to the input terminal land rows 45, 46, 47 of the flexible printed circuit board 24 and output terminal land rows 64, 65, 66 which respectively correspond to the input terminal land rows 45, 46, 47 of the flexible printed circuit board 25. The other side of the circuit board 21 has the contact 55 (see FIG. 2), which connects the connector 80a (see FIG. 4) provided to the circuit board 80 on the carriage 8, and a conductor pattern (not shown), which connects the output terminal land rows 61 to 66 with the contact 55. The terminal lands in the input terminal land rows 45, 46, 47 of the flexible printed circuit board 24 are connected with the terminal lands in the output terminal land rows 61, 62, 63, in a one-to-one relationship. Likewise, the terminal lands in the input terminal land rows 45, 46, 47 of the flexible printed circuit board 25 are connected with the terminal lands in the output terminal land rows 64, 65, 66, in a one-to-one relationship. The common voltage wires 54 for supplying power to the IC chip 22 are connected with the common voltage wires 52 of the flexible printed circuit board 24 via the terminal lands of the circuit board 21. Similarly, the common voltage wires 54 for supplying power to the IC chip 23 is connected with the common voltage wires 52 of the flexible printed circuit board 25 via the terminal lands of the circuit board 21.

As shown in FIGS. 9B, 9C and 13, in a condition where the flexible printed circuit boards 24, 25 are fixed to the circuit board 21, each of the terminal lands in the terminal land rows 46, 47 of the flexible printed circuit boards 24, 25 provided on a side which the flexible printed circuit boards 24, 25 extend, has a substantially circular shape when viewed from the above. Each of the terminal lands in the terminal land rows 62, 63, 65, 66 of the circuit board 21 corresponding to the terminal land rows 46, 47 of the flexible printed circuit boards 24, 25 also has a substantially circular shape when viewed from above. Each of the terminal lands in the terminal land row 45 of the flexible printed circuit boards 24, 25 and in the terminal land row 61 of the circuit board 21, has a substantially rectangular shape when viewed from above. The terminal lands in the terminal land row 47, provided nearest the IC chip holding portion 43, and the opposed terminal lands in the terminal land rows 63, 66 of the circuit board 21 have an area larger than the terminal lands in the other terminal land rows 46, 62, 65. This structure prevents the flexible printed circuit boards 24, 25 from coming off from the circuit board 21 even if the flexible printed circuit boards 24, 25 are bent at a connecting portion or disposed with a warped state when the terminal lands of the flexible printed circuit boards 24, 25 and the circuit board 21 are soldered each other. Further, the flexible printed circuit boards 24, 25 are not likely to come off from the circuit board 21 even when the flexible printed circuit boards 24, 25 are bent during assembling. The terminal lands that are apt to come off and to be soldered has the larger areas, so that the flexible printed circuit boards 24, 25 is reduced their tendency to come off from the circuit board 21.

The circuit board 21 has through holes 72, which pass therethrough, with respect to the terminal lands in the terminal land rows 62, 63, 65, 66. An electrically conductive material, making up the terminal, extends along the inner of each through hole 72. In each terminal land, the through hole 72 is provided at a position deviated from a center of the terminal land.

Figure 15:
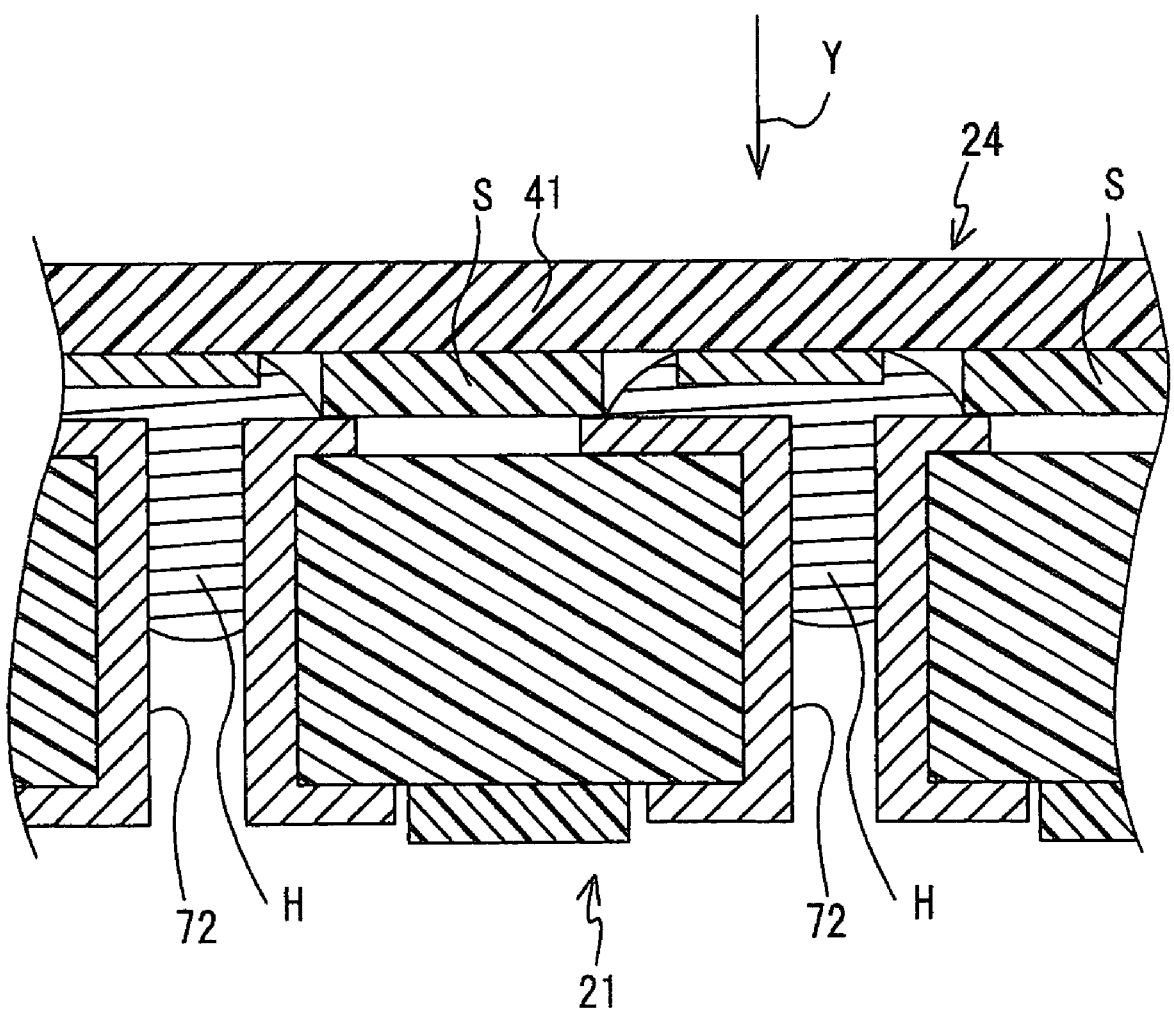
FIG. 15 is a sectional view taken along a line B-B in FIG. 14, looking in the direction of the appended arrows.

Solder H (see FIG. 15) is applied to each terminal land in the terminal land rows 61 to 66 of the circuit board 21 before the flexible printed circuit boards 24, 25 are connected to the circuit board 21. The flexible printed circuit boards 24, 25 are adhered to the circuit board 21 by pressing in a direction indicated by an arrow Y in FIG. 15, using a heat bar, while the terminal lands of the flexible printed circuit boards 24, 25 are aligned with the terminal lands 61 to 66 of the circuit board 21. Then, the solder H, applied to the circuit board 21 in advance, melts by heat, thereby connecting the terminal lands of the flexible printed circuit boards 24, 25 and the circuit board 21 each other. At that time, excessive solder H enters the through holes 72, so that the adjacent terminal lands do not short-circuit by the excessive solder H. The flexible printed circuit board 24, 25 have solder resists S at positions where the solder resists S do not cover the terminal lands, in order to prevent the melted solder H from overflowing into the adjacent terminal lands. The solder resists S are not provided at an area all over the terminal land rows 61 to 66 existing on the circuit board 21. If through holes are provided to the flexible printed circuit boards 24, 25, problems may occur because the flexible printed circuit boards 24, 25 are thinner than the circuit board 21. For example, melted solder S protrudes from the flexible printed circuit boards 24, 25, so that the melted solder S adheres to a tool for pressing the flexible printed circuit boards 24, 25 and the circuit board 21 to affect the operation, or a short circuit may occur between the terminal lands. However, in this embodiment, the flexible printed circuit boards 24, 25 do not have through holes, so that the flexible printed circuit boards 24, 25 and the circuit board 21 can be readily connected with each other without the melted solder S protruding from the flexible printed circuit boards 24, 25. Further, the solder S is effectively heated and sufficiently melted via the flexible printed circuit boards 24, 25, so that opposite terminal lands of the flexible printed circuit boards 24, 25 and the circuit board 21 can be surely connected.

Figure 10:
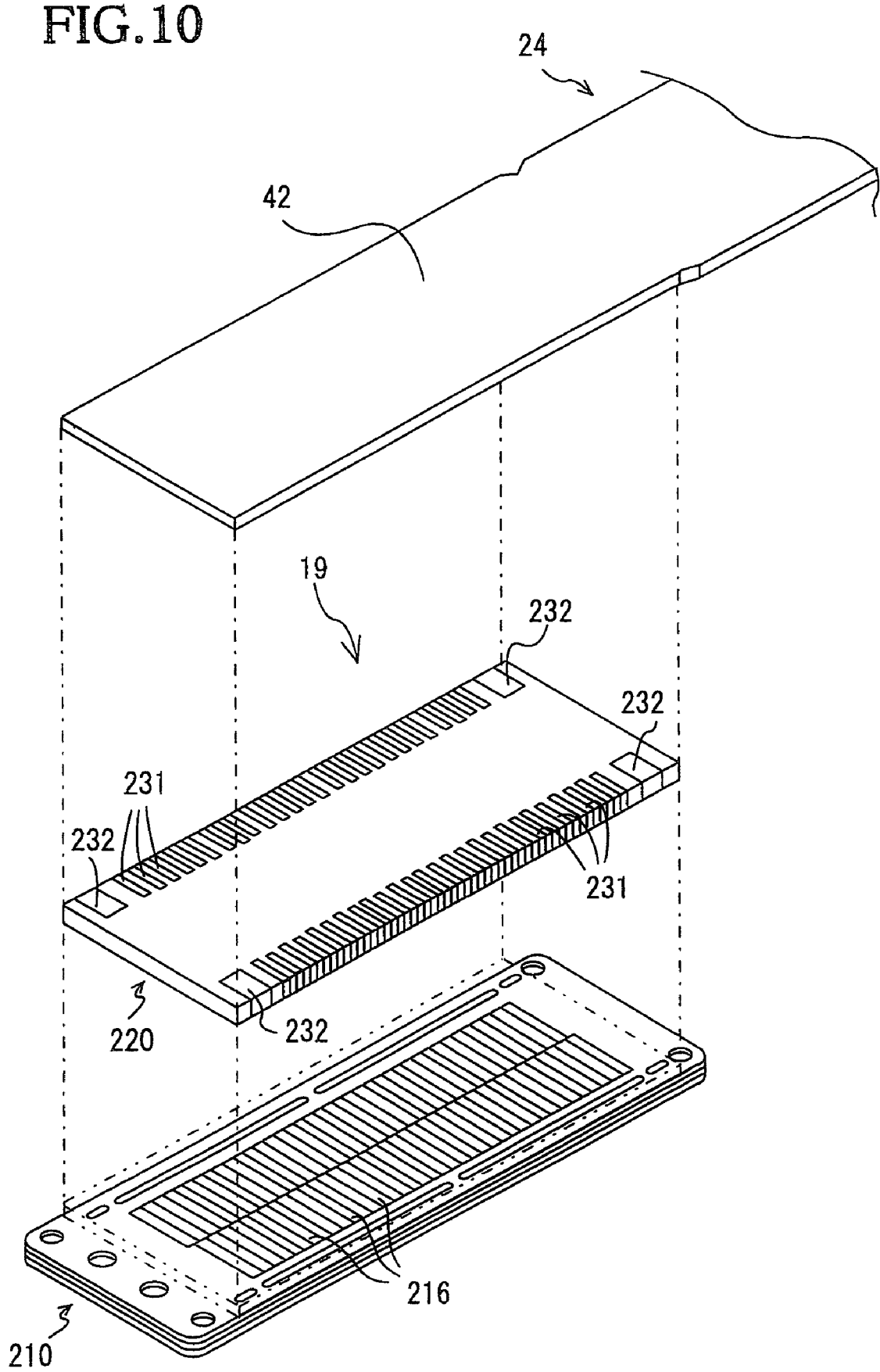
FIG. 10 is a disassembled perspective view of one of the printheads.

Referring to FIG. 10, the structure of the printheads 19, 20 will be described below. Both the printheads 19, 20 have the same structure, so that description will be provided only with respect to the printhead 19. In the embodiment, the printhead 19 of an ink-jet type includes a plurality of recording elements aligned and integrated into one-piece. Each of the recording elements includes a pressure chamber for storing ink therein, a piezoelectric element for selectively applying a pressure to the ink in the pressure chamber, an electrode for applying a voltage to the piezoelectric element, a nozzle for ejecting ink stored in the pressure chambers.

More specifically, as shown in FIG. 10, the printhead 19 includes the substantially rectangular cavity plate 210 and the plate-type piezoelectric actuator 220. The cavity plate 210 has a plurality of metal plates stacked on one another and a plurality of pressure chambers 216 on its surface. The pressure chambers 216 are grooves that extend in a direction perpendicular to a longitudinal side of the cavity plate 210, and aligned in two parallel rows along the longitudinal direction of the cavity plate 210. The plate-type piezoelectric actuator 220, having a substantially rectangular shape, is adhered to the cavity plate 210 so as to cover and close the pressure chambers 216. The head connecting portion 42 of the flexible printed circuit board 24 is adhered and connected on the upper surface of the piezoelectric actuator 220. The pressure chambers 216 aligned in two rows connect the respective nozzle rows 7a, 7b to eject ink droplets downward. Each of the printheads 19, 20 has the pressure chambers 216 aligned in two rows, so that four different colors of ink can be ejected from the printheads 19, 20.

Figure 11:
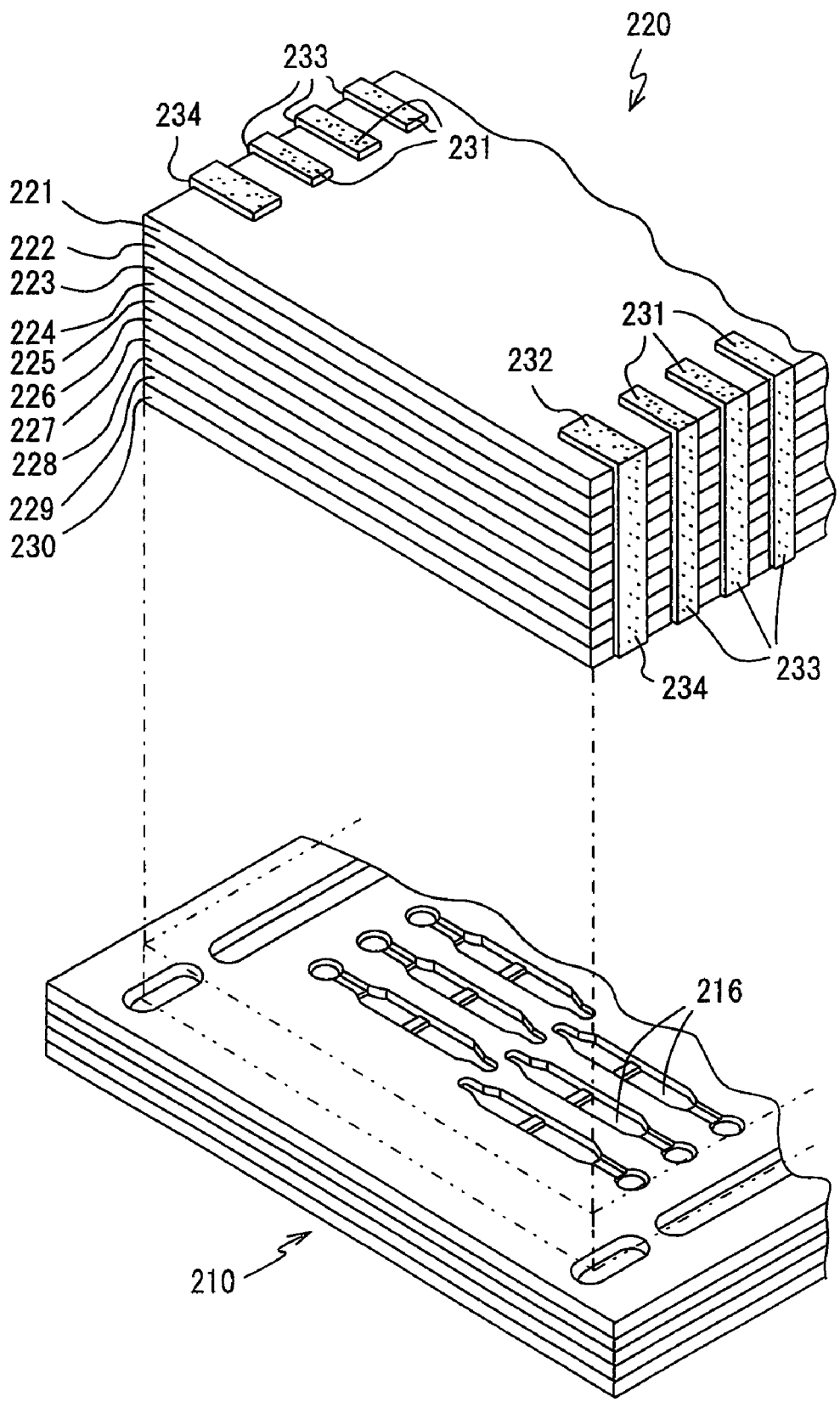
FIG. 11 is a disassembled perspective view of a plate-type piezoelectric actuator and a cavity plate separated from each other.
Figure 12:
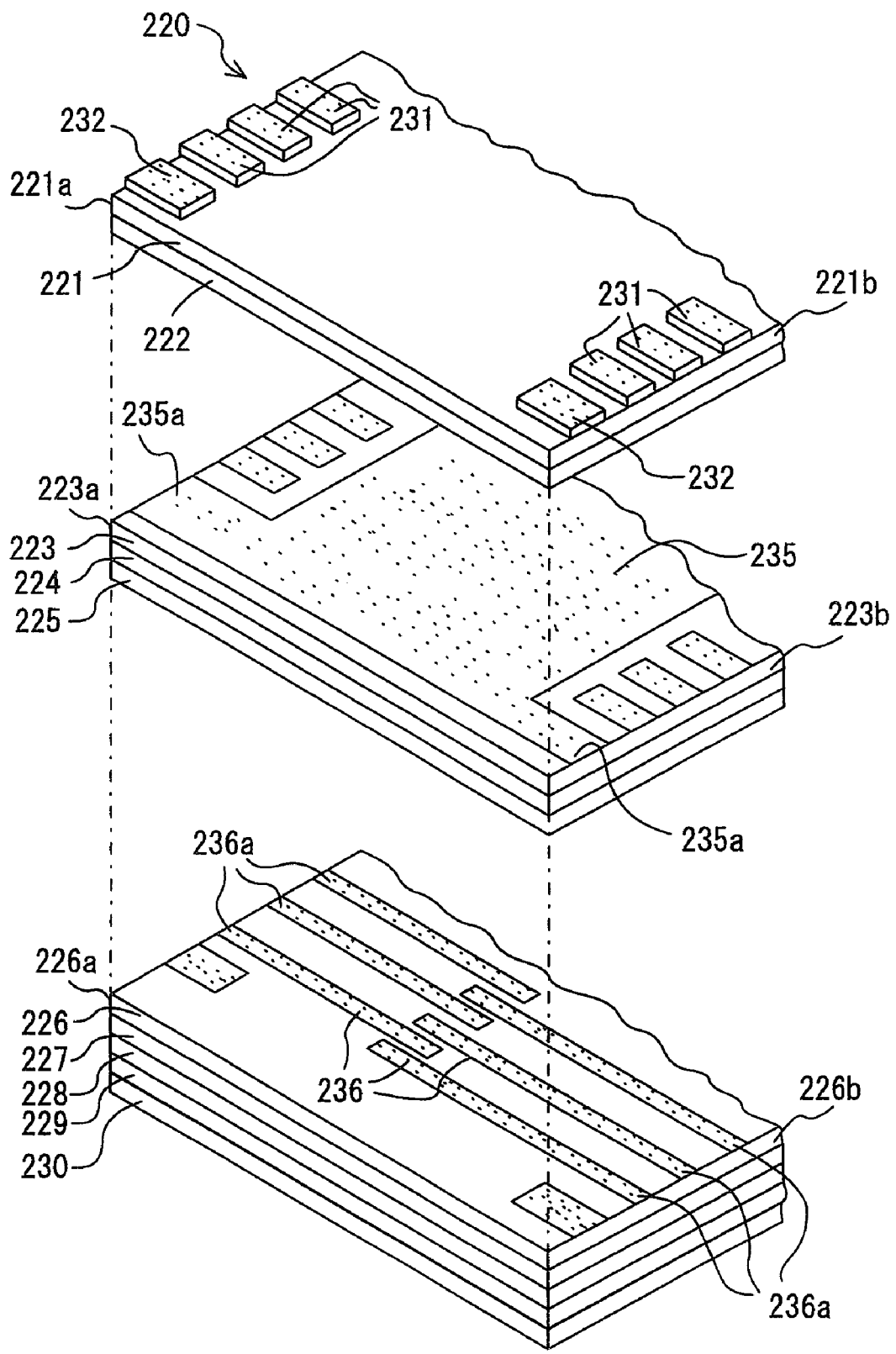
FIG. 12 is a disassembled perspective view of the plate-type piezoelectric actuator.

As shown in FIGS. 11 and 12, ten piezoelectric sheets 221 to 230 are laminated each other, in this order from above, in the piezoelectric actuator 220. The piezoelectric sheets 226, 228, 230 have the same structure. Each of the piezoelectric sheets 226, 228, 230 has a strip of drive electrodes 236, on its surface, at positions corresponding to the pressure chambers 216 provided on the cavity plate 210. Each end 236a of the drive electrodes 236 reaches a side 226a or 226b of the piezoelectric sheet 226. The drive electrodes 236 are provided on the piezoelectric sheets 228, 230 in a similar manner.

The piezoelectric sheets 223 to 225, 227 and 229 have the same structure. A wide common electrode 235 for the plurality of the pressure chambers 216 is provided on the upper surface of each piezoelectric sheet 223, 224, 225, 227, 229. Each end 235a of the common electrodes 235 reaches a side 223a or 223b of the piezoelectric sheet 223. The common electrode 235 is provided on the piezoelectric sheets 224, 225, 227, 229 in a similar manner.

Surface electrodes 231 corresponding to the drive electrodes 236 and surface electrodes 232 corresponding to the common electrodes 235 are provided on the upper surface of the uppermost piezoelectric sheet 221, along sides 221a, 221b of the piezoelectric sheet 221. After the piezoelectric sheets 221 to 230 are laminated to construct the piezoelectric actuator 220 as described later, side electrodes 233, 234 are provided to the both sides of the piezoelectric sheets 221 to 230 extending perpendicular to the upper and lower surface of the sheets 221 to 230. The side electrodes 233 electrically connect the drive electrodes 236 with the surface electrodes 231. The side electrodes 234 electrically connect the common electrodes 235 with the surface electrodes 232.

As shown in FIG. 10, the head connecting portion 42 of the flexible printed circuit board 24 is placed on the upper surface of the piezoelectric actuator 220 of the printhead 19. The surface electrodes 231 and 232 of the piezoelectric actuator 220 are respectively soldered on the terminals 53a of the output wires 53 and the terminals 52a of the common voltage wires 52 in a one-to-one relationship. The flexible printed circuit board 25 is connected with the piezoelectric actuator 220 of the printhead 20 in the same manner. When the printheads 19, 20 are in a condition of being capable of performing printing operation, the common voltage wires 49, 52, 54 are connected to a portion having a common potential, for example, a ground. As signals are outputted to arbitrary output wires 53 according to print data, active portions of the piezoelectric sheets 221 to 230 between the drive electrodes 236 and the common electrodes 235 connected with the arbitrary output wires 53 deform, and pressure is applied to ink in the pressure chambers 216 corresponding to the deformed active portions. Thus, ink droplets are ejected from the nozzles.

As described above, each of the printheads 19, 20 is provided with one flexible printed circuit board 24, 25 and one IC chip 22, 23. Accordingly, the common voltage wires 52 can be provided at both edges of the longitudinal sides of the flexible printed circuit boards 24, 25, and the surface electrodes 232 for the common electrodes 235 corresponding to the four ejection nozzle rows 7a to 7d of the printheads 19, 20 can be connected to the common potential, that is, a ground, via the common voltage wires 52 and the common voltage wires of the conductor pattern of the circuit board 21. When a single flexible printed circuit board and a single IC chip are provided with respect to the four nozzle rows 7a to 7d for common use, instead of separately providing the flexible printed circuit boards 24, 25 with the IC chips 22, 23 like the embodiment, the common voltage wires 52 for two nozzle rows 7b, 7c disposed inside cannot directly connect the circuit board 21. Thus, the common electrodes 235 cannot be sufficiently at the common potential. However, each of the printheads 19, 20 has the flexible printed circuit board 24, 25 and the IC chip 22, 23, so that the surface electrodes 232 of the printheads 19, 20 can be easily connected to the circuit board 21. Accordingly, the common electrodes 235 can be sufficiently at the common potential.

Figure 2:
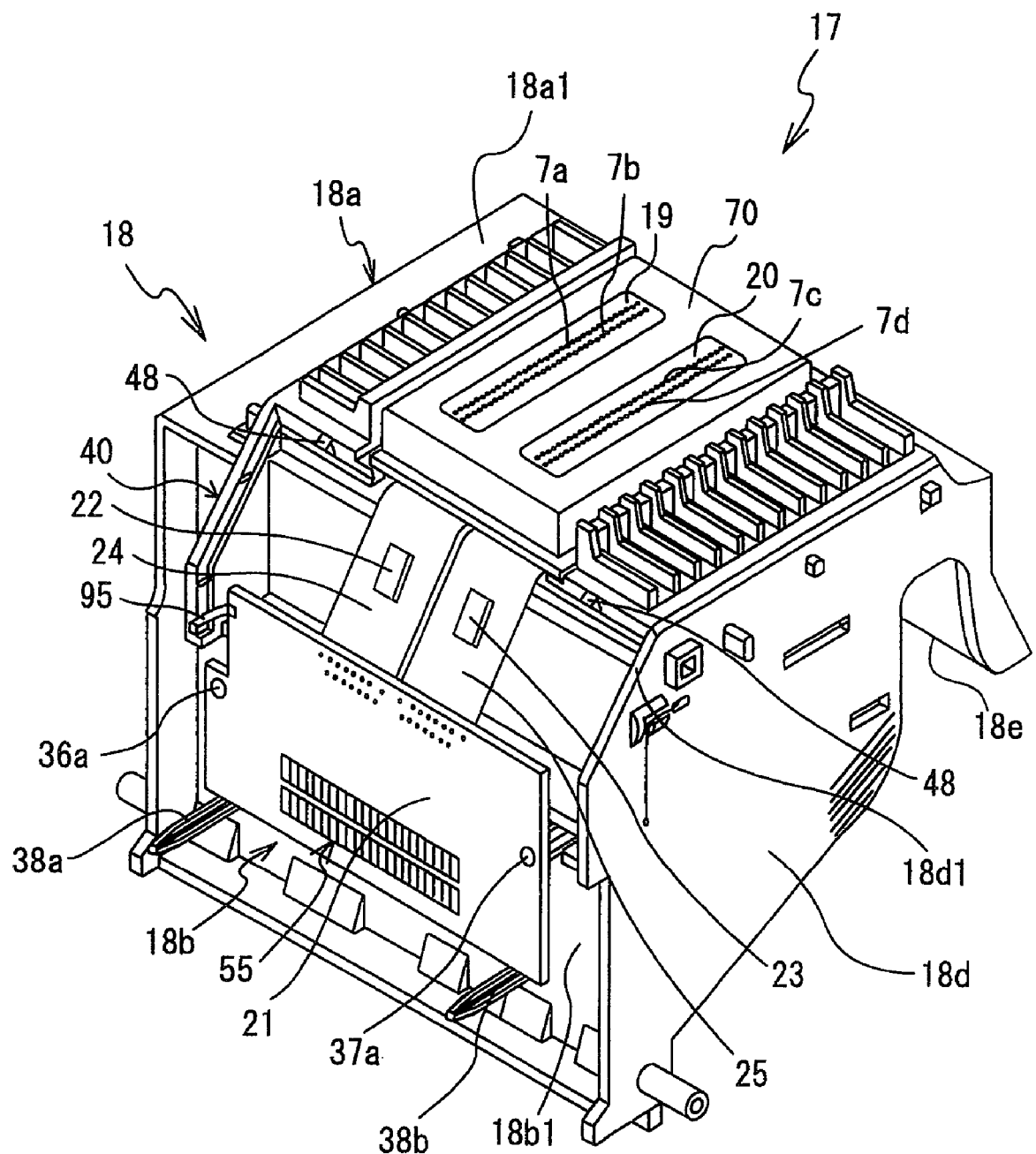
FIG. 2 is a bottom perspective view of a printhead unit when viewed from the back.
Figure 3:
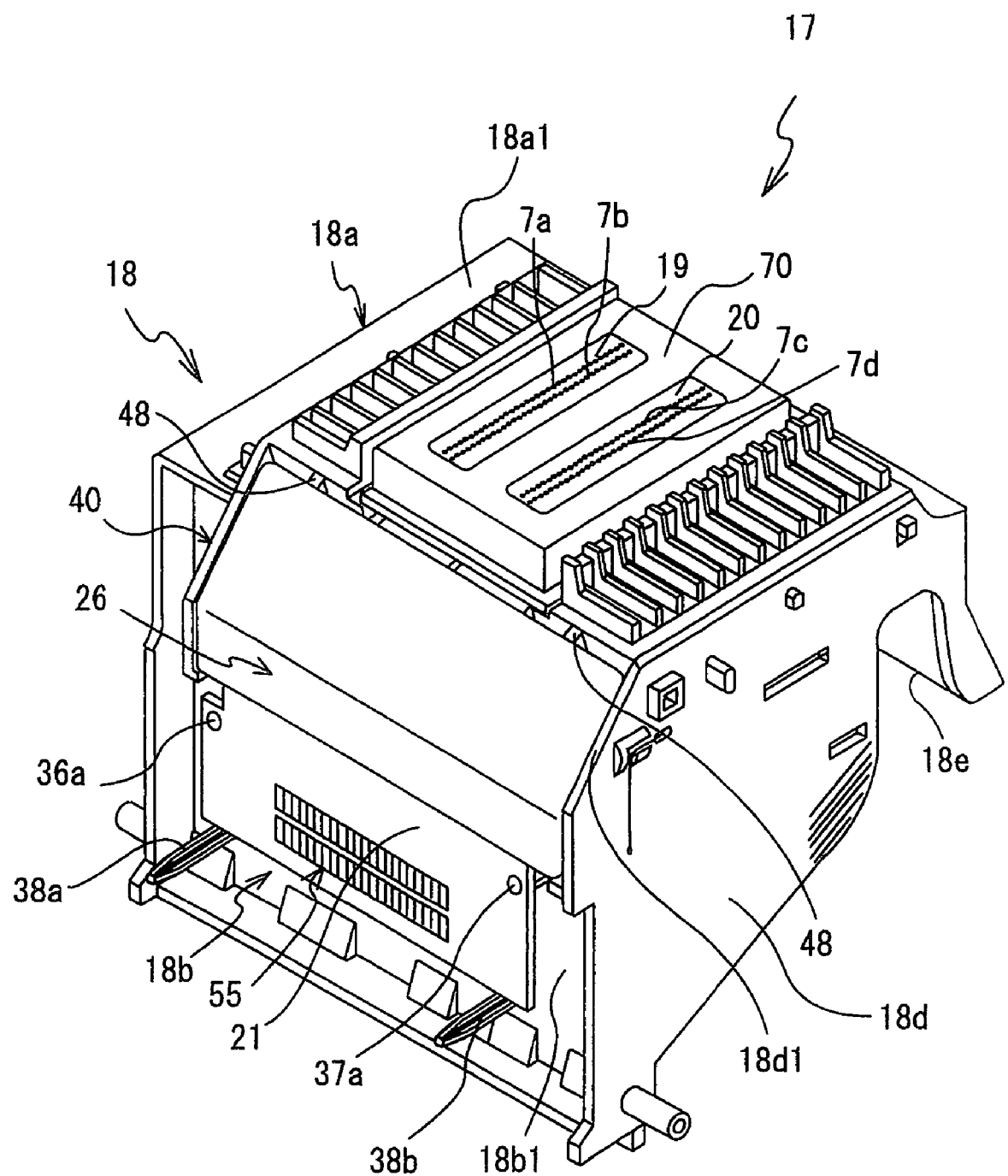
FIG. 3 is a bottom perspective view of the printhead unit attached with a heat sink when viewed from the back.
Figure 6:
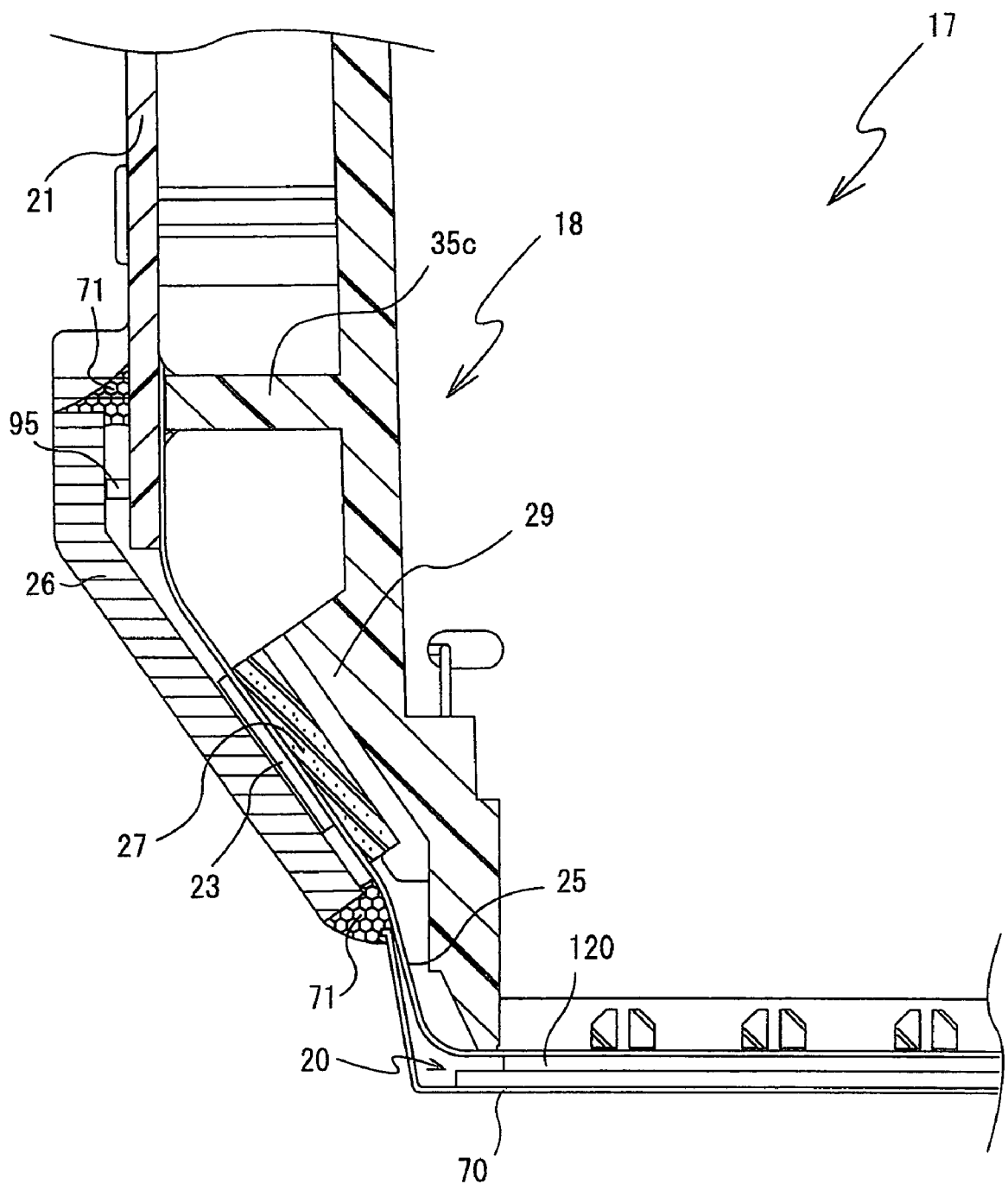
FIG. 6 is a sectional view taken along a line A-A in FIG. 5, looking in the direction of the appended arrows.

As shown in FIGS. 2 and 6, the surface, on which the contact 55 of the circuit board 21 is provided, has a leaf spring 95. The leaf spring 95 contacts the heat sink 26 and is connected with the ground through a common voltage wire provided in the conductor pattern on the circuit board 21.

Figure 14:
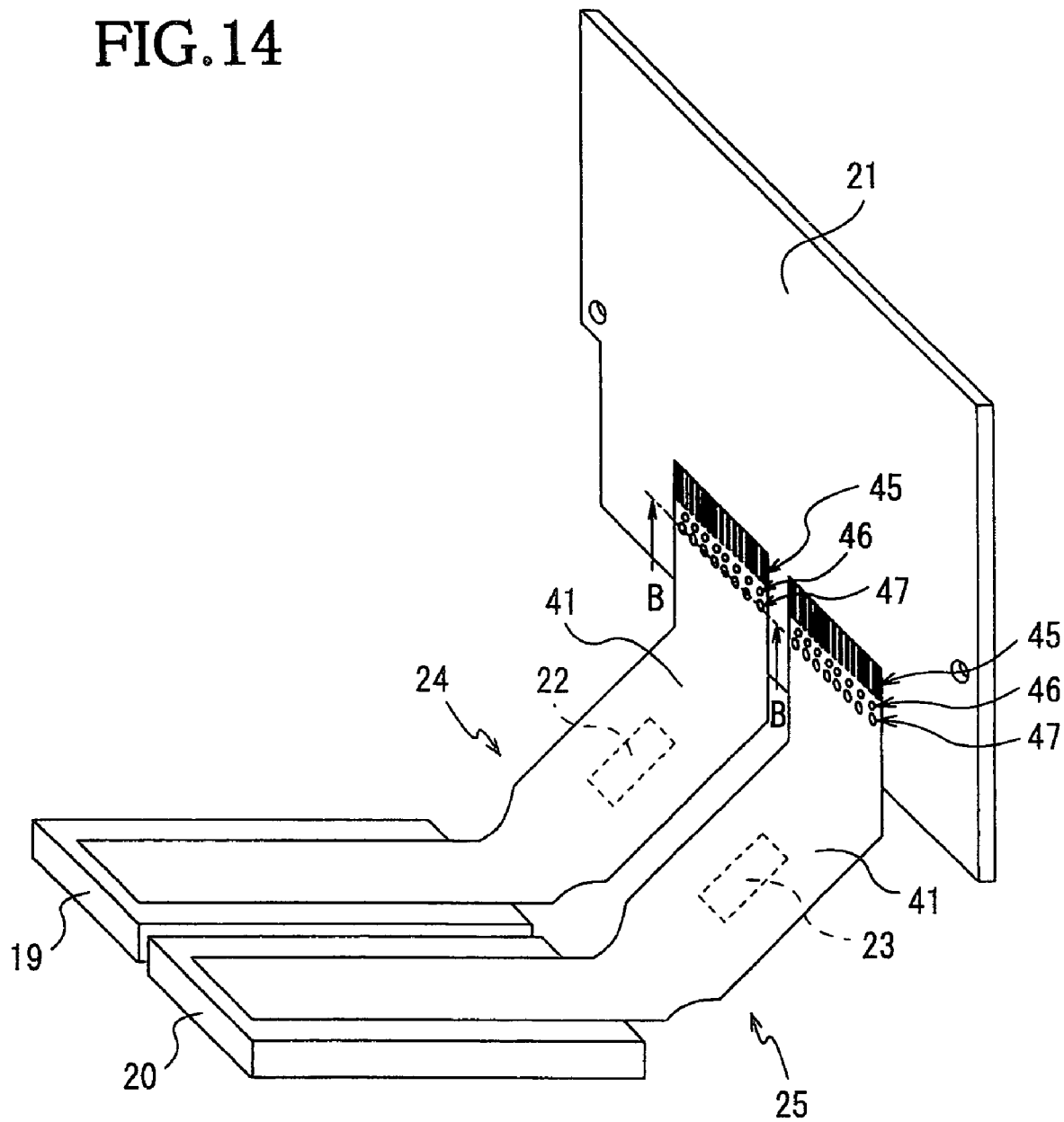
FIG. 14 is a perspective view of the circuit board, the flexible printed circuit boards and the printheads connected with each other while the flexible printed circuit boards is bent.
Figure 16:
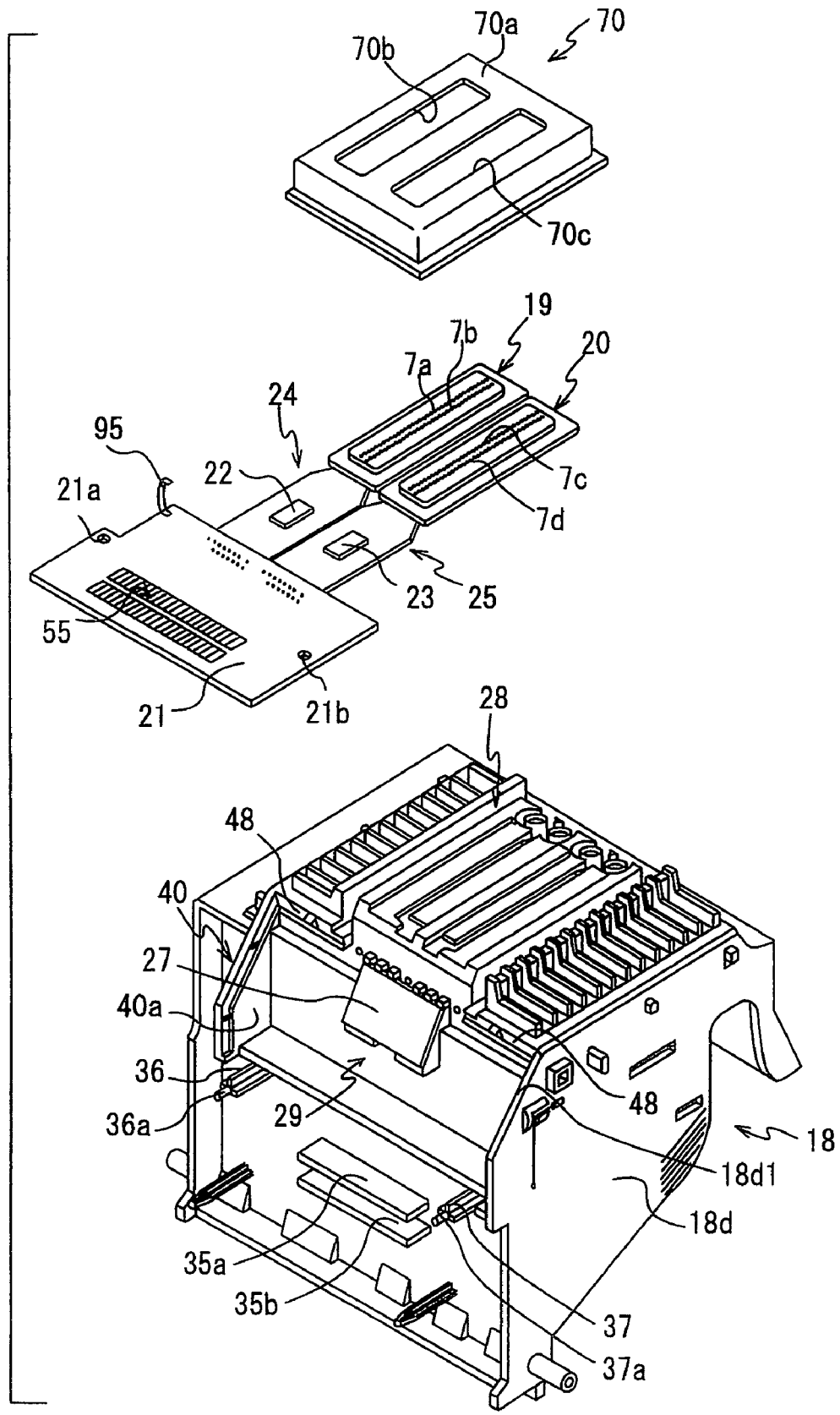
FIG. 16 is a perspective view of a process of assembling the head cover and an assembly of the flexible printed circuit boards, the circuit board and the printheads with the head holder.

FIG. 14 shows a state where the printheads 19, 20, the flexible printed circuit boards 24, 25, and the circuit board 21 are connected with each other as described above. FIG. 16 shows a process of assembling the head cover 70 and an assembly of the printheads 19, 20, the flexible printed circuit boards 24, 25 and the circuit board 21 with the head holder 18. The printheads 19, 20 are adhesively fixed to the head holding portion 28 of the head holder 18 using an adhesive and covered with the head cover 70 so that nozzle rows 7a to 7d are exposed from openings 70b, 70c. The circuit board 21 is fixed to the protrusions 36, 37 on the back wall 18b, as described above.

At that time, the elastic member 27 made of rubber or resin is adhesively fixed to the elastic member rest 29 in advance. The portions, on which the IC chips 22, 23 are mounted, of the flexible printed circuit boards 24, 25 are located on the inclined surface of the elastic member 27. The flexible printed circuit boards 24, 25 are bent into an obtuse angle at both sides of the portions where the IC chips 22, 23 are provided. Thus, the flexible printed circuit boards 24, 25 situated on the head holder 18 from the bottom wall 18a, on which the printheads 19, 20 are disposed, to the back wall 18b, on which the circuit board 21 is provided. Accordingly, a strong force do not apply on the bent portions of the flexible printed circuit boards 24 and 25, so that the wires provided on the flexible printed circuit boards 24, 25 are not damaged.

The heat sink 26 is adhesively fixed to the right side wall 18 and heat sink holding wall 40 using an adhesive, while covering the flexible printed circuit boards 24, 25. At that time, the heat sink 26 contacts the IC chips 22, 23 at its inner surface so as to press the elastic member 27. That is, the IC chips 22, 23 are urged against the heat sink 26 by the elastic member 27 so as to enable to conduct the heat. With this structure, it is unnecessary to adhere the IC chips 22, 23 to the heat sink 26 using an adhesive. Further, this structure prevents production of stress between the IC chips 23, 22 and the heat sink 26 due to heat. Therefore, the heat generated by the IC chips 22, 23 can be effectively emitted. The heat sink 26 is connected with the ground via the circuit board 21 using the leaf spring 29, so that static electricity can be also eliminated. Thus, the IC chips 22, 23 are prevented from being damaged by static electricity.

The contact 55 of the circuit board 21 is not covered with the heat sink 26, but is exposed to the outside, when the heat sink 26 is fixed as described above. The contact 55 of the circuit board 21 contacts the connector 80a of the carriage 8 and is connected with the printer control circuit board via the circuit board 80 and the flexible printed circuit boards 24, 25, when the head holder 18 is attached to the carriage 8. The terminal land rows 45 to 47 of the flexible printed circuit boards 24, 25 can be directly exposed to the outside to connect a substrate provided on the carriage 8, without providing the circuit board 21.

Figure 17A:
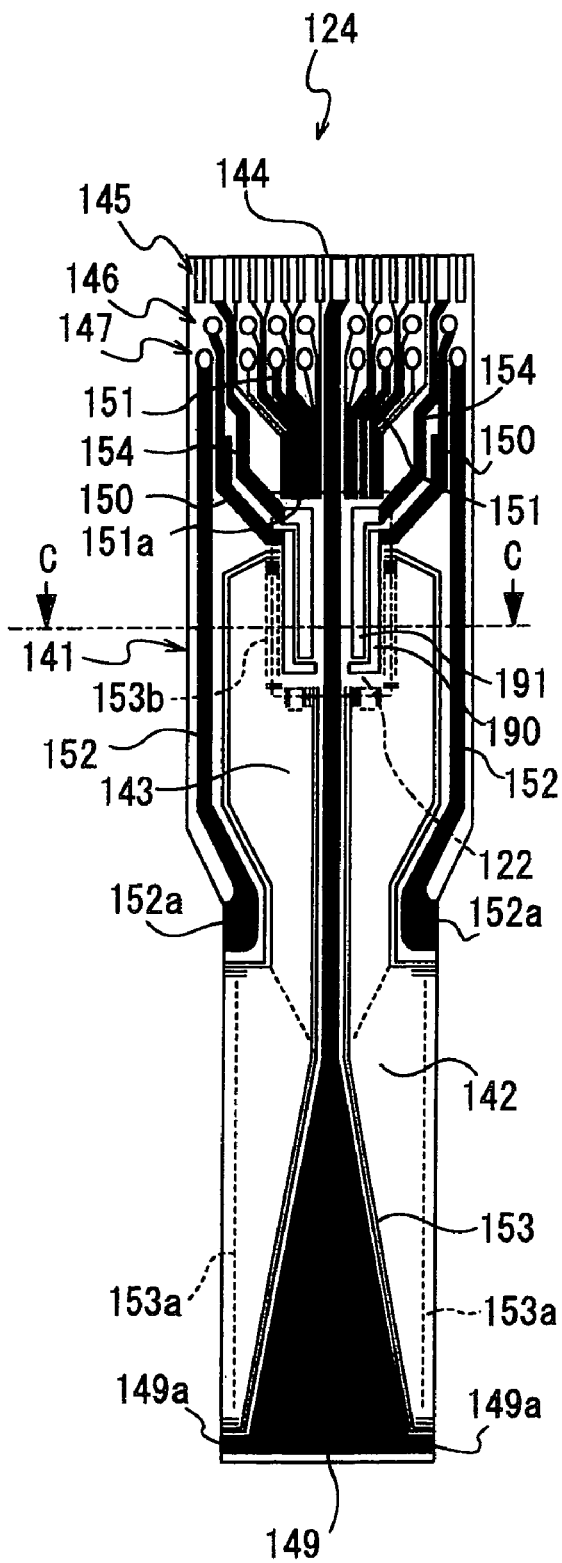
FIG. 17A is a plan view of a flexible printed circuit board of a variation.
Figure 17B:
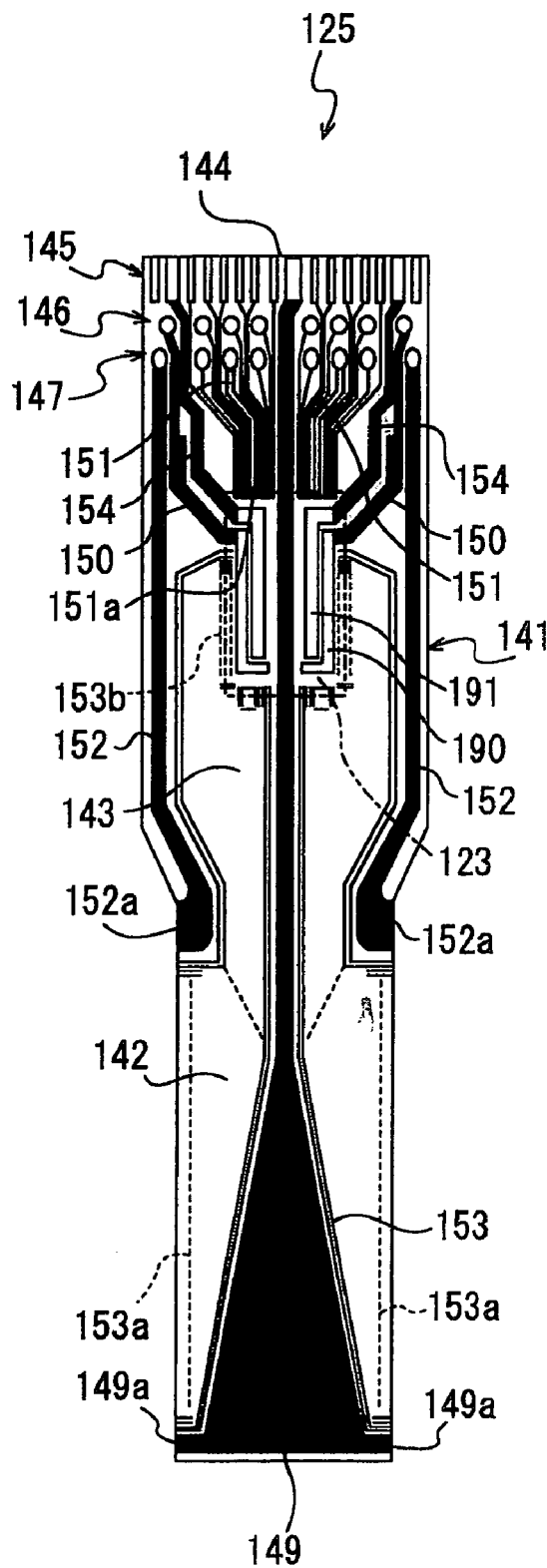
FIG. 17B is a plan view of a flexible printed circuit board of the variation.
Figure 18:
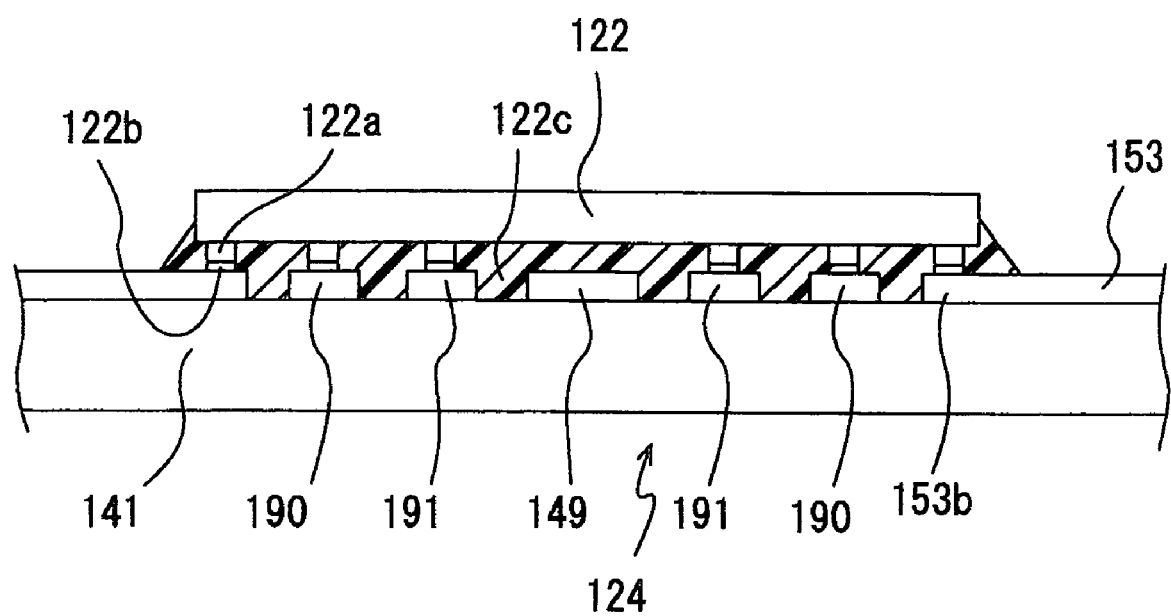
FIG. 18 is a sectional view taken along a line C-C of FIG. 17A, looking in the direction of the appended arrows.

Alternatively, flexible printed circuit boards can be structured as shown in FIGS. 17A, 17B and 18.

As shown in FIG. 17A, a flexible printed circuit board 124 includes a band-shaped flexible insulation 141 made of polyimide resin and a plurality of wires provided on the insulation 141. The insulation 141 includes a substantially rectangular head connecting portion 142, a substantially rectangular IC chip holding portion 143, and a connector portion 144. The head connecting portion 142 is overlapped with the piezoelectric actuator 220 of the printhead 19, which is the same printhead as the above-described embodiment, and connected with each other. The IC chip holding portion 143 extends from one of shorter sides of the head connecting portion 142 so as to become wider than the head connecting portion 142. The connector portion 144, extending from the IC chip connecting portion 143, connects the circuit board 21. An IC chip 122 is flip-chip mounted on the IC chip holding portion 143 for generating a voltage to drive the plate-type piezoelectric actuator 220.

The IC chip 122 has a drive circuit built-in. The drive circuit is driven by power supplied by power supply wires (plus voltage wires) 150 and common voltage wires (zero voltage wires) 154 and outputs ejection signals to output wires 153 corresponding to the nozzles in the nozzle rows 7a, 7b in accordance with drive signals inputted from signal wires 151. Gold bumps 122a are provided to the underside of the IC chip 122 to connect a conductor pattern of the flexible printed circuit board 124. The flexible printed circuit board 124 has the conductor pattern that includes the power supply wires 150, the common voltage wires 154, the signal wires 151, the output wires 153, and common voltage wires 149, 152 for the output wires 153. The conductor pattern is substantially symmetrical about a center line with respect to a longitudinal side of the flexible printed circuit board 124. In accordance with this structure, the IC chip 122 has two drive circuits built therein. The common voltage wires 152 are provided along the both edges of the longitudinal sides of the IC chip holding portion 143 of the flexible printed circuit board 124. The common voltage wire 149 is disposed along the center line in the longitudinal direction of the flexible printed circuit board 124, extending from one end to the other end. The piezoelectric actuator 220 is charged and discharged via the common voltage wires 149, 152 in cooperation with the output wires 153. The conductor pattern of the flexible conductor pattern 124 is formed using tinned copper.

Ends of the common voltage wires 149, 152, the power supply wires 150, the common voltage wires 154 and the signal wires 151 are disposed on the connecting portion 144 so as to constitute a plurality of input terminal land rows 145, 146, 147. The flexible printed circuit board 124 is provided with power terminals 190 connected with the power supply wires 150, terminals 191 connected with the common voltage wires 154, terminals 151a connected with the signal wires 151, and terminals 153b connected with the output wires 153 at positions to be under the IC chip 122 provided on the flexible printed circuit board 124. As shown in FIG. 18, the gold bumps 122a of the IC chip 122 are contacted with the terminals 151a, 153b, 191, and the power terminals 190. Then, the IC chip 122 is pressed by heat from above. By doing so, gold-tin eutectic portions 122b are formed between the gold bumps 122a of the IC chip 122 and the conductor pattern of the flexible printed circuit board 124 and thus the IC chip 122 and the flexible printed circuit board 124 are connected. The IC chip 122 is also fixed using resin 122c. The common voltage wire 149, extending along the center line, of the flexible printed circuit board 124 is disposed under the IC chip 122, but does not connect the IC chip 122.

The head connecting portion 142 has a plurality of the terminals 153a of the output wires 153 along the both edges of the longitudinal sides. Terminals 149a, 152a of the common voltage wires 149, 152 are disposed at the both ends of the rows of the terminals 153a.

Ends of the common voltage wires 149, 152, the power supply wires 150, the common voltage wires 154 and the signal wires 151 are disposed on the connecting portion 144 so as to constitute the plurality of the input terminal land rows 145, 146, 147. The input terminal land rows 145, 146, 147 are provided in several rows so that the flexible printed circuit board 124 can be within a predetermined width while a width of each input terminal land is widened more than a width of each signal wire 151. A flexible printed circuit board 125 shown in FIG. 17B has the same structure as the flexible board 124 shown in FIG. 17A. Further, an IC chip 123 similar to the IC chip 122 is mounted on the flexible printed circuit board 125.

The head connecting portion 142 of the flexible printed circuit board 124 is placed on the upper surface of the piezoelectric actuator 120 of the printhead 19. The terminal lands 153a of the output wires 153 of the head connecting portion 142 are connected with the respective surface electrodes 131 of the piezoelectric actuator 220 by soldering. The terminals 149a, 152a of the common voltage wires 149, 152 are connected with the surface electrodes 132 of the piezoelectric actuator 120 in a one-to-one relationship by soldering. The flexible printed circuit board 125 shown in FIG. 17B is connected to the piezoelectric actuator 220 of the printhead 20 in a similar manner.

When the printheads 19, 20 using the flexible printed circuit boards 124, 125 are in a condition of being capable of performing printing operation, the common voltage wires 149, 152, 154 are connected to a portion having a common potential, for example, a ground, in the circuit board 21. As signals are outputted to arbitrary output wires 153 according to print data, active portions of the piezoelectric sheets 221 to 230 between the drive electrodes 236 and the common electrodes 235 connected with the arbitrary output wires 153 deform, and pressure is applied to ink in the pressure chambers 216 corresponding to the deformed active portions. Thus, ink droplets are ejected from the nozzles. At that time, when the common electrodes 235 are at the ground potential, a desired voltage is applied to active portions of the piezoelectric sheets between the drive electrodes 236 and the common electrodes 235 and thus the piezoelectric sheets can deform by a desired amount. However, the common electrodes 235 provided between the piezoelectric sheets are extremely thin and of high resistance. Therefore, when the flexible printed circuit boards 24, 25 are used in the printhead 19, 20, portions of the common electrodes 235 opposed to the drive electrodes 236 provided at positions far from the terminals 152a of the common voltage wires 152, may not be sufficiently at the ground potential. As a result, the voltage to be applied to the piezoelectric sheets becomes low, so that a predetermined amount of ink ejection may not be obtained.

The use of the flexible printed circuit boards 124, 125 produces an effect better than the use of the flexible printed circuit boards 24, 25. As described above, the surface electrodes 232 provided at both the ends of the common electrodes 235 are connected with the respective common voltage wires 149, 152. By doing so, the entire common electrodes 235 can be further surely uniformly at the ground potential. As a result, a voltage can be uniformly applied to the piezoelectric sheets corresponding to the pressure chambers 216. Thus, the ejection nozzles can eject ink droplets uniformly.

As described above, each of the printheads 19, 20 is provided with one flexible printed circuit board 124, 125 and one IC chip 122, 123. Accordingly, the common voltage wires 152 can be provided at both edges of the longitudinal sides of the flexible printed circuit boards 124, 125, and the surface electrodes 232 for the common electrodes 235 corresponding to the four ejection nozzle rows 7a to 7d of the printheads 19, 20 can be connected to the common potential, that is, a ground, via the common voltage wires 152 and the common voltage wires of the conductor pattern of the circuit board 21. When a single flexible printed circuit board and a single IC chip are provided with respect to the four nozzle rows 7a to 7d for common use, instead of separately providing the flexible printed circuit boards 24, 25 with the IC chips 122, 123 like the embodiment, the common voltage wires 52 for two nozzle rows 7b, 7c disposed inside cannot directly connect the circuit board 21. Thus, the common electrodes 235 cannot be sufficiently at the common potential. However, each of the printheads 19, 20 has the flexible printed circuit board 124, 125 and the IC chip 122, 123, so that the surface electrodes 232 of the printheads 19, 20 can be easily connected to the circuit board 21. Accordingly, the common electrodes 235 can be sufficiently at the common potential.

According to the ink-jet printer 1 of the invention using the flexible printed circuit board 124, 125, a single IC chip 122, 123 is provided on the flexible printed circuit board 124, 125. The common voltage wire 149, passing under the IC chip 122, 123, extends one end on the recording element side to the other end opposite to the recording element side. Therefore, the common voltage wire 149 can be connected with the recording elements provided far from the IC chip 122, 123. With this structure, terminals, which are connected to the common voltage wire 149 provided on the side of the recording elements provided far from the IC chip 122, 123, can be sufficiently at a common potential, and the ink-jet printer 1 can achieve a desired recording performance based on signals supplied from the output wires 53.

One of the ends 235a of the common electrode 235, disposed at the end of the rows of the terminals, is connected with the common voltage wire 149, and the other end 235a is connected with the common voltage wires 152 extending along the side of the flexible printed circuit board 124, 125. Therefore, the entire common electrode 235 can be uniformly at the common potential, and thus, the plurality of the recording elements can have substantially the same recording properties.

In the printhead 19, 20, the recording elements are aligned in two rows. The ends 235a of the common electrode 235 in both rows are connected to the common voltage wire 149 extending in the recording element alignment direction along the center line of the flexible printed circuit board 124, 125. The other ends 235a of the common electrode 235 are connected with the common voltage wires 152 extending along the both sides of the flexible printed circuit board 124, 125. Therefore, the terminals of the recording elements in the two rows provided near the IC chip 122, 123 and far from the IC Chip 122, 123 can be substantially uniformly at the common potential. Thus, the entire terminals of the recording elements in the two rows can be substantially uniformly at the common potential.

According to the ink-jet printer 1 of the invention using the flexible printed circuit boards 24, 25, 124, 125, the following effects can be obtained.

In order to connect wires of a flexible printed circuit board and wires of a circuit board to each other, terminal lands are provided on the both boards. A solder layer is provided on the terminal lands on one of the boards. Then, the terminal lands of the flexible printed circuit board and the circuit board are connected by applying heat and pressure. The solder layer between the terminal lands is melted and adheres the flexible printed circuit board to the circuit board.

However, in accordance with growing in sophistication of functions of the equipment, the number of wires provided on the flexible printed circuit boards is increased. Thus, a pitch between terminal lands on the fine-line flexible printed circuit board becomes small, so that it is necessary to control an amount of applied solder or a thickness of a solder layer to stem the solder's overflow and inflow between adjacent terminal lands. If the amount of solder applied to the terminal lands varies, excessive solder overflows into adjacent terminal lands, thereby causing a short circuit in terminal lands and a connection failure.

However, in the connection structure between the flexible printed circuit board 24, 25, 124, 125 and the circuit board 21 of the embodiment, the terminal lands 62, 63, 65, 66 of the circuit board 21 have the through holes 72 that pass through the circuit board 21. The terminal lands 45 to 47, 145 to 147 of the flexible printed circuit boards 24, 25, 124, 125, opposed to the terminal lands 62, 63, 65, 66 of the circuit board 21, do not have through holes. Therefore, when the flexible printed circuit boards 24, 25, 124, 125 can be connected to the circuit board 21 by applying pressure and heat from the side of the flexible printed circuit boards 24, 25, 124, 125, without melted solder H overflowing to the outside of the flexible printed circuit boards 24, 25, 124, 125. As a result, the solder H can be effectively heated and melted sufficiently, so that the terminal lands 46, 47, 146, 147 of the flexible printed circuit boards 24, 25, 124, 125 and the terminal lands 62, 63, 65, 66 of the circuit board 21 can be surely connected with each other. Further, excessive solder H enters the through holes 72, and thus, a short circuit can be prevented from occurring between the adjacent terminal lands.

In addition, each of the through holes 72 is disposed at a position deviated from the center of each the terminal lands 62, 63, 65, 66. With this structure, even when the area of the terminal lands 46, 47, 146, 147 is small, excessive solder H enters the through holes 72. Thus, the terminal lands 46, 47, 146, 147 of the flexible printed circuit boards 24, 25, 124, 125 can be solidly connected to the terminal lands 62, 63, 65, 66 of the circuit board 21.

In the ink-jet printer 1 of the embodiment of the invention, a single flexible printed circuit board 24, 25, 124, 125 is provided to a single printhead 19, 20. The common voltage wires 52, 152 are provided along the both edges in the recording element alignment direction, so that the common voltage wires 52, 152 can be easily connected to the recording elements disposed on inward side in the recording element rows. Therefore, the recording elements can be at the common potential and can be uniformly driven.

Each of the flexible printed circuit boards 24, 25, 124, 125 has a single IC chip 22, 23, 122, 123, so that the common voltage wire 52, 152 can be provided along the opposite edges, sandwiching the IC chip 22, 23, 122, 123 therebetween. Therefore, the common voltage wires 52, 152 can be easily connected to the recording elements disposed on inward side in the recording element rows. Further, the IC chip 22, 23, 122, 123 can apply a voltage corresponding to each of the recording elements provided to the printhead 19, 20.

The printhead 19, 20 has the recording elements aligned in two rows. Each of the flexible printed circuit boards 24, 25, 124, 125 has a single IC chip 22, 23, 122, 123 for driving the two rows of the recording elements. Further, the common voltage wires 52, 152 are provided along the edges in the recording element alignment direction. Accordingly, the recording elements in the two rows can be easily connected to the respective common voltage wires 52, 152.

According to the ink-jet printer 1 of the invention, the terminal lands of the signal wires 51 are aligned in several rows. Further, the terminal lands, corresponding to the terminal lands of the signal wires 51, of the circuit board 21 are also aligned in several rows. Therefore, the width of the terminal lands of the signal wires 51 can be sufficiently wider than that of the signal wires 51 itself. The terminal lands in the terminal land row 47, 147, provided at a position furthest in a direction of extending the wires of the flexible printed circuit boards 24, 25, 124, 125, have an area larger than the terminal lands in the other terminal land rows 45, 46. Therefore, adhesive strength between the terminal lands 45 to 47, 145 to 147 of the flexible printed circuit boards 24, 25, 124, 125 and the terminal lands 61 to 66 of the circuit board 21 can be increased. Thus, the terminal lands in the terminal land rows 45 to 47, 145 to 147 can be prevented from peeling from the terminal lands in the terminal land rows 61 to 66.

The terminal lands in the terminal land row 47, 147, provided at a position furthest in a direction of extending the wires of the flexible printed circuit boards 24, 25, 124, 125, has a length, in the recording element alignment direction, longer than the other terminal lands in the terminal land rows 46, 146. Therefore, the adhesive area becomes large and the terminal lands in the terminal land rows 45 to 47 can be prevented from peeling from the terminal lands in the terminal land rows 61 to 66.

The terminal lands in the terminal land rows 45 to 47, 147 of the flexible printed circuit boards 24, 25, 124, 125 and the terminal lands in the terminal land rows 61 to 66 of the circuit board 21 are aligned in three rows on each board 24, 25, 124, 125, 21. With this structure, the strength to unstick the flexible printed circuit boards 24, 25, 124, 125 from the circuit board 21 is not concentrated on one of the rows of the terminal lands. Accordingly, the concentration of the unstick strength can be scattered on the three rows of the terminal lands in the terminal land rows 45 to 47, 145 to 147, 61 to 66 to prevent the terminal lands in the terminal land rows from peeling from each other.

The flexible printed circuit boards 24, 25, 124, 125 are bent in a direction parallel to the width direction of the flexible printed circuit board 24, 25, 124, 125, at a position near the terminal land row 47, 147 provided at the position furthest in the wire extending direction, and are routed in arbitrary directions. The terminal lands in the terminal land rows 47, 147 located nearest the bent portion has an area larger than the other terminal lands in the terminal row 46, 146. Accordingly, the terminal lands can be prevented from peeling from the terminal land of the circuit board 21. Thus, the terminal lands in the terminal land row 47, 147 located nearest the bent portion of the flexible printed circuit board 24, 25, 124, 125 can be prevented from coming off from the terminal lands of the circuit board 21.

In the ink-jet printer 1 of the invention, the flexible printed circuit boards 24, 25, 124, 125, each of which has the IC chip 22, 23, 122, 123 for driving the printhead 19, 20, are disposed along the outer surface of the head holder 18. The heat sink 26 is disposed on the side opposed to the head holder 18, with respect to the flexible printed circuit boards 24, 25, 124, 125. In addition, the elastic member 27 is provided between the flexible printed circuit boards 24, 25, 124, 125 and the head holder 18. The flexible printed circuit boards 24, 25, 124, 125 freely deform by an urging force from the elastic member 27, and the IC chips 22, 23, 122, 123, are pressed against the heat sink 26. Accordingly, heat generated in the IC chips 22, 23, 122, 123 can be effectively dissipated to the outside, so that the printheads 19, 20 can stably actuate.

The flexible printed circuit boards 24, 25, 124, 125 are located along the outer surface of the head holder 18 including the bottom wall 18a and the back wall 18b. The ends of the flexible printed circuit boards 24, 25, 124, 125 located at the outer surface 18b1 of the back wall 18b have connecting terminal lands for connecting with external equipment. Therefore, power can be supplied to the IC chips 22, 23, 122, 123 from the external equipment by connecting the flexible printed circuit boards 24, 25, 124, 125 with the external equipment.

The flexible printed circuit boards 24, 25, 124, 125 are bent into an obtuse angle at the intersections of the bottom wall 18a and the inclined surface and the back wall 18b and the inclined surface. That is, the flexible printed circuit boards 24, 25, 124, 125 are bent at two portions. Therefore, loads are not regionally applied to the flexible printed circuit boards 24, 25, 124, 125 and thus the flexible printed circuit boards 24, 25, 124, 125 are not damaged.

The circuit board 80 is provided on the carriage 8 that can move along the recording sheet P. The back wall 18b of the head holder 18 is provided with the circuit board 21 having the contact 55 that connects the wires on the flexible printed circuit boards 24, 25, 124, 125 with the carriage 8. The heat sink 26 is fixed between the printheads 19, 20 and the circuit board 21 while exposing the contact 55 of the circuit board 21. Accordingly, the heat sink 26 can cover the flexible printed circuit boards 24, 25, 124, 125 and heat generated in the IC chips 22, 23, 122, 123 can be dissipated to the outside.

The heat sink 26 is connected to the ground via the circuit board 21, so that static electricity generated by the heat sink 26 can be dissipated to the ground via the circuit board 21. Thus, the IC chips 22, 23, 122, 123 can be prevented from being damaged by the static electricity.

The IC chip 22, 23, 122, 123 is provided on each of the flexible printed circuit boards 24, 25, 124, 125, so that a mounting space for the IC chips 22, 23, 122, 123 can be saved.

While the invention has been described in detail with reference to a specific embodiment thereof, it would be apparent to those skilled in the art that various changes and modifications may be made therein without departing from the spirit of the invention.

The invention is not limited to the ink-jet recording apparatus, but applied to a thermal recording apparatus and a wire impact recording apparatus.

What is claimed is:

1. A recording apparatus comprising:
    a recording head that includes a plurality of recording elements having terminal lands and performs recording on a recording medium;
    a flexible printed circuit board that includes:
        a flexible insulation member;
        a plurality of feeder wires, each of which connects to at least one of the terminal lands of each of the recording elements;
        a first common voltage wire that connects the other terminal lands of each of the recording elements to a common potential; and
        a drive circuit that drives the recording head via the feeder wires;
    a heat sink which is positioned adjacent to the drive circuit;
    a head holder that includes an elastic member rest;
    an elastic member which is attached to the elastic member rest; and
    elastic resin;
    wherein the elastic resin is used to attach the heat sink to the head holder; and
    wherein the portion of the flexible printed circuit board on which the drive circuit is mounted is located on the elastic member in a manner that the drive circuit is pressed directly against the heat sink by an urging force from the elastic member.

2. The recording apparatus according to claim 1 further comprising:
    a first circuit board; and
    a bottom wall and a back wall which are attached to form the head holder;
    wherein the first circuit board is attached to the back wall, and the flexible printed circuit board is attached to the first circuit board.

3. The recording apparatus according to claim 2,
    wherein the elastic member rest which is attached to the intersection of the back wall and bottom wall of the head holder; and
    wherein the elastic member rest has an inclined surface, the elastic member is attached to the inclined surface of the elastic member rest, and the flexible printed circuit board is attached the elastic member in a manner that creates two bent portions in the flexible printed circuit board where each bent portion forms an obtuse angle.

4. The recording apparatus according to claim 3,
    wherein the heat sink covers the flexible printed circuit board except for an area of the flexible printed circuit board which connects to the first circuit board.

5. The recording apparatus according to claim 4, further comprising a second circuit board,
    wherein the first circuit board is connected with the second circuit board.

6. The recording apparatus according to claim 4, where the first circuit board further comprises:
    a contact; and
    a ground;
    wherein the contact is connected to the heat sink and to the ground.

7. A method for manufacturing a recording apparatus comprising the steps of:
    (1) attaching an elastic member to a head holder;
    (2) attaching a print head to the head holder;
    (3) affixing a circuit board to the head holder;
    (4) affixing a flexible circuit board including an IC chip to the head holder such that the portion of the flexible circuit board on which the IC chip is mounted is located on the elastic member;
    (5) affixing a heat sink to the head holder such that the IC chip is positioned adjacent to the heat sink so as to directly contact the heat sink; and
    (6) affixing terminals on one end of the flexible circuit board to the print head and terminals on the other end of the flexible circuit board to terminals on the circuit board.

8. The method of claim 7, further comprising the step of affixing terminals on one end of the circuit board to terminals on a second circuit board which is attached to a carriage.

9. The method of claim 7,
    wherein the terminals of the flexible circuit board are connected to the circuit board by using solder and applying heat and pressure to the flexible circuit board.

10. The method claim 7,
    wherein the terminals on the circuit board have a through hole therein.

* * * * *

UNITED STATES PATENT AND TRADEMARK OFFICE
CERTIFICATE OF CORRECTION

PATENT NO. : 7,570,494 B2 Page 1 of 1
APPLICATION NO. : 11/481523
DATED : August 4, 2009
INVENTOR(S) : Suzuki et al.

It is certified that error appears in the above-identified patent and that said Letters Patent is hereby corrected as shown below:

Title page, item (63)   Related U.S. Application Data should read

-- Continuation of Application No. 10/238,197, filed on September 10, 2002, now Pat. No. 7,149,090. --

Title page, item (30)   Foreign Application Priority Data should read

-- Sep. 11, 2001   (JP) ................ 2001-274919
   Sep. 11, 2001   (JP) ................ 2001-274933
   Sep. 11, 2001   (JP) ................ 2001-274957
   Sep. 11, 2001   (JP) ................ 2001-274972
   Sep. 11, 2001   (JP) ................ 2001-274977
   Sep. 14, 2001   (JP) ................ 2001-279016 --

Signed and Sealed this

Seventeenth Day of November, 2009

David J. Kappos
*Director of the United States Patent and Trademark Office*